(12) United States Patent
Schurman et al.

(10) Patent No.: US 10,306,024 B2
(45) Date of Patent: May 28, 2019

(54) COMPRESSION DICTIONARY SNAPSHOT SYSTEM AND METHOD

(71) Applicant: Amazon Technologies, Inc., Seattle, WA (US)

(72) Inventors: Eric Michael Schurman, Seattle, WA (US); Almann T. Goo, Bellevue, WA (US); Muneer Mirza, Bellevue, WA (US); Christopher Allen Suver, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 377 days.

(21) Appl. No.: 15/081,698

(22) Filed: Mar. 25, 2016

(65) Prior Publication Data

US 2017/0279933 A1 Sep. 28, 2017

(51) Int. Cl.
| | |
|---|---|
| G06F 16/00 | (2019.01) |
| H04L 29/06 | (2006.01) |
| H04L 29/08 | (2006.01) |
| G06F 16/27 | (2019.01) |
| G06F 16/22 | (2019.01) |
| H03M 7/30 | (2006.01) |

(52) U.S. Cl.
CPC .......... *H04L 69/04* (2013.01); *G06F 16/2228* (2019.01); *G06F 16/275* (2019.01); *H03M 7/30* (2013.01); *H03M 7/3084* (2013.01); *H03M 7/3091* (2013.01); *H03M 7/6064* (2013.01); *H03M 7/6076* (2013.01); *H04L 67/06* (2013.01)

(58) Field of Classification Search
CPC .......... H03M 7/30; H04L 29/06; H04L 69/04; G06F 17/30327; G06F 8/71; G06F 17/3053; G06F 11/1453; G06F 17/30067
See application file for complete search history.

(56) References Cited

U.S. PATENT DOCUMENTS

| | | | |
|---|---|---|---|
| 5,396,228 A | 3/1995 | Garahi | |
| 7,155,173 B2 | 12/2006 | Leung et al. | |
| 7,590,633 B1* | 9/2009 | Manley | ............ G06F 17/30067 |
| 8,572,218 B2 | 10/2013 | Narayanan et al. | |
| 2005/0132346 A1* | 6/2005 | Tsantilis | ................... G06F 8/71 717/168 |
| 2008/0010300 A1* | 1/2008 | Bunn | ...................... H03M 7/30 |
| 2011/0145313 A1* | 6/2011 | Narayanan | ............. H04L 69/04 709/203 |
| 2013/0254197 A1 | 9/2013 | Hay et al. | |
| 2014/0082320 A1 | 3/2014 | Christoffersson et al. | |

(Continued)

*Primary Examiner* — Etienne P Leroux

(74) *Attorney, Agent, or Firm* — Davis Wright Tremaine LLP

(57) ABSTRACT

A system configured to generate a set of compression dictionary snapshots. The system can determine a subset of a set of compression dictionary definitions, the subset having a first subset comprising one or more definitions that have changed since a time of a previous snapshot and a second subset having one or more definitions associated with a predetermined portion of the dictionary. The system can further generate and store snapshots based at least in part on the determined subset of one or more definitions and determine a plurality of active snapshots from the set of snapshots such that the set of one or more definitions is included in the plurality of active snapshots.

20 Claims, 16 Drawing Sheets

(56) References Cited

U.S. PATENT DOCUMENTS

| | | | |
|---|---|---|---|
| 2014/0281312 A1* | 9/2014 | Danilak | G06F 17/30327 |
| | | | 711/162 |
| 2014/0321764 A1 | 10/2014 | Zarom | |
| 2014/0330784 A1* | 11/2014 | Sundaram | H04L 29/06 |
| | | | 707/639 |
| 2016/0283329 A1* | 9/2016 | Natanzon | G06F 11/1453 |
| 2017/0270121 A1* | 9/2017 | Gu | G06F 17/3053 |

* cited by examiner

COMPRESSION DICTIONARY SNAPSHOT SYSTEM AND METHOD

CROSS-REFERENCE TO RELATED APPLICATIONS

This application incorporates by reference for all purposes the full disclosure of co-pending U.S. patent application Ser. No. 15/081,685, filed on Mar. 25, 2016, entitled "COMPRESSION DICTIONARY SYSTEMS AND METHODS" and co-pending U.S. patent application Ser. No. 15/081,697, filed on Mar. 25, 2016, entitled "COMPRESSION DICTIONARY GENERATION SERVICE SYSTEM AND METHOD."

BACKGROUND

Providing digital content to consumers quickly is important for content providers. For example, content consumers increasingly expect digital content such as web sites, images or documents to arrive quickly when requested or else the content consumer will become dissatisfied and choose alternative content or an alternative content provider. On the other hand, content being provided to users is becoming increasing complex and therefore larger in size. Although networks that send digital content have seen improved throughput over time, these networks are nonetheless stressed by the growing demand for digital content on a variety of user devices. Accordingly, systems and methods that compress digital content for transmission over a network can be desirable because such systems and methods can allow digital content to be provided to content consumers faster.

BRIEF DESCRIPTION OF THE DRAWINGS

Various techniques will be described with reference to the drawings, in which.

DETAILED DESCRIPTION

Figure 1:
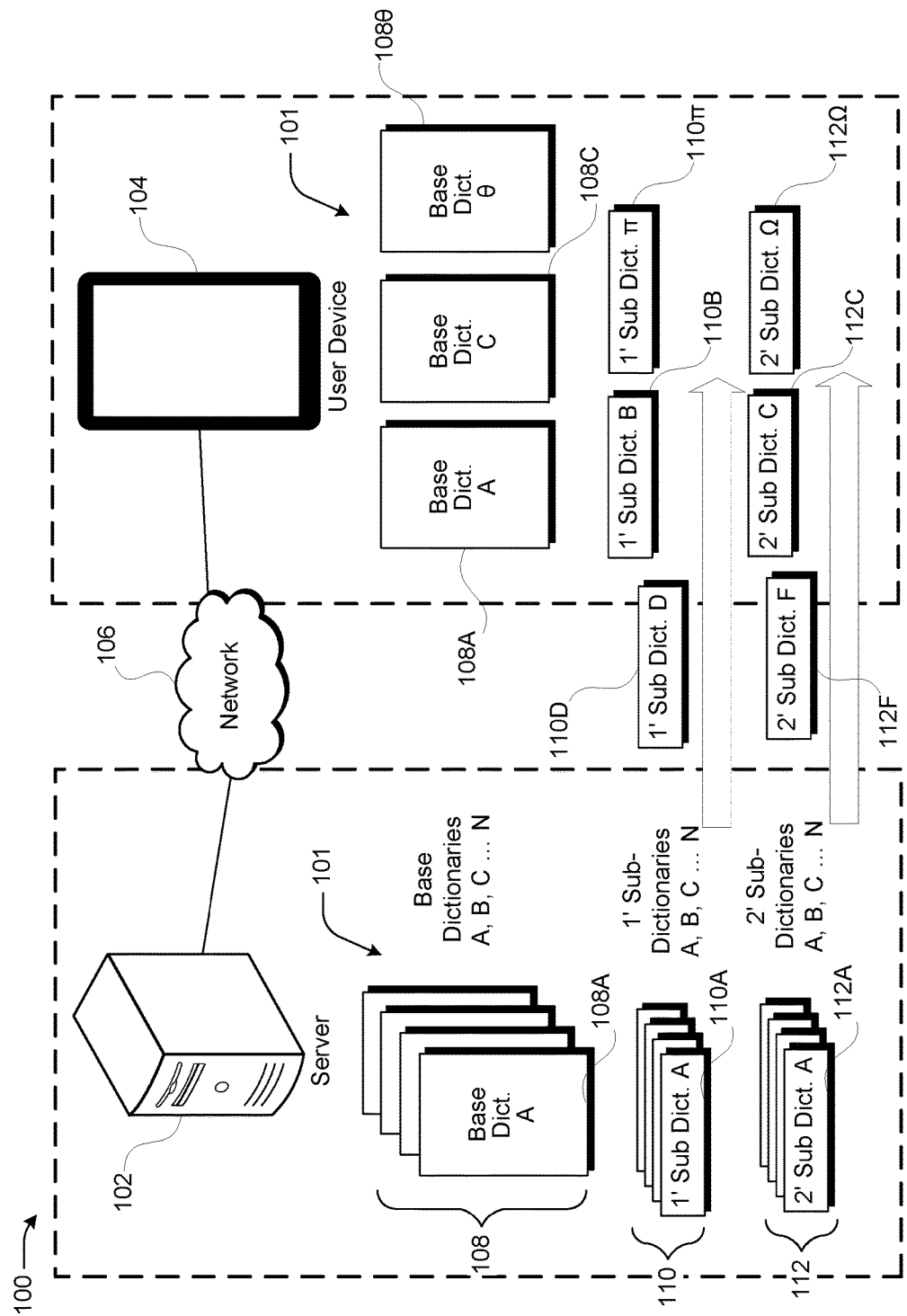
FIG. 1 illustrates an example of a server and user device that are each associated with a plurality of dictionaries.

This disclosure application relates to shared dictionaries, which can allow for compression of content being sent from a server to a user device. For example, the server can be associated with and have access to a first set of one or more dictionaries that are local to the server and the user device can be associated with a second set of one or more dictionaries that are local to the user device. At least a portion of these first and second dictionary sets can include the same dictionaries. In other words, the server and user device can share or have dictionaries in common.

The server can compress content being sent to the user device using a set of dictionaries selected by the server and/or user device and the content can be received and decompressed at the user device. For example, the dictionaries can include a set definitions, where the definitions include strings of characters such as letter, numbers, or the like, where identifiers for such definition are shorter than the definition. Accordingly, compression of content can include the server replacing portions of the content that match a definition with a shorter identifier and at the user device, the identifier is replaced with the definition to decompress the content. This can be achieved because the set of dictionaries selected for communication between the server and user device can define a common set of definitions.

In some examples, a compression dictionary can comprise a lookup table where a plurality of symbols are associated with a plurality of respective definitions. In other examples, a definition of a dictionary can be defined by a location and a length, or the like. For example, a dictionary can comprise a long string of characters and an identifier can include a beginning character and an ending character (e.g., a definition could include "character 1314 through character 1397"). Additionally, in some examples, a definition can also include a modifier of a dictionary including an indicator of a repeat, filter, transpose, or the like. For example, a definition can include "characters 1314-1397, and repeat characters 1388-1397 twenty times."

In some examples, a set of one or more dictionaries can be selected for use during a session based on criteria such as characteristics of the content requested, a user profile, the user device, network conditions, and the like. For example, where a user profile indicates that the user likes to browse a certain type of website, a set of dictionaries can be selected for use during a session that is most effective for compressing content of such websites. In other words, a set of dictionaries used in a session can be selected based on anticipated browsing during the session based on prior user browsing history. In further examples, the set of dictionaries being used during a user session can be changed, replaced or modified based on changes in the content requested, a user profile, the user device; network conditions, and the like.

Dictionaries used can be interrelated including sub-dictionaries that are dependent upon a base dictionary or another sub-dictionary. In some examples, a base dictionary can be larger than sub-dictionaries and the smaller sub-dictionaries can be used to augment or modify the base dictionary. For example, a set of sub-dictionaries can be selected for use during a session that is tailored to various characteristics of the session as discussed above.

In some examples, a set of dictionaries can be selected that are already shared by the server and user device. In other examples, a set of dictionaries can be selected where the user device does currently share or locally have access to one or more dictionary of the set and such missing one or more dictionaries can be sent to the user device so that the user device has local access to the dictionaries.

Further examples include performing rolling snapshot updates of one or more dictionary. The techniques described include obtaining a snapshot manifest, incrementing a snapshot count, and determining first and second subsets of a set of one or more identifiers and associated definitions defined by the one or more dictionary. The snapshot manifest may be a listing of a set of identifiers and associated definitions defined by the one or more dictionary. The listing may include location information that indicates where the one or more identifiers and associated definitions of the set of one or more identifiers and associated definitions may be found within the dictionary, within a rolling snapshot update, or at some other location. Thus, the location information may include information that uniquely distinguishes each snapshot, dictionary, and one or more identifiers and associated definitions defined by the dictionary.

The snapshot count may be any method for keeping track of the current or most recent snapshot update and the active snapshot updates within a sliding window representing the maximum snapshot depth. For example, the snapshot count may be a counter that is incremented for each snapshot update. Alternatively, the snapshot count may be a pointer that is updated for each snapshot update, or may be information configured according to some other scheme for keeping track of current and past partial and/or full snapshots of the dictionary.

A first subset of identifiers and associated definitions may be a subset of the one or more identifiers and associated definitions of the dictionary that have changed or are new (referred to as an "incremental set" or "change set") since a time of a previous full snapshot or snapshot update. A second subset of one or more identifiers and associated definitions may include a proportion of set of the one or more identifiers and associated definitions of the dictionary, regardless of whether the one or more identifiers and associated definitions in the second subset are new or have changed since a time of the previous snapshot. The proportion may be determined by the maximum snapshot depth; for example, a maximum snapshot depth of five may result in a second subset comprised of 20% (i.e., ⅕th) of the set of identifiers and associated definitions of the dictionary.

The second subset may comprise identifiers and associated definitions mutually exclusive from previous second subsets for snapshots up to the maximum snapshot depth. In other words, for a maximum snapshot depth of five, the identifiers and associated definitions may be the first 20% portion of the one or more identifiers and associated definitions may include different identifiers and associated definitions than the second, third, fourth, and fifth portions of identifiers and associated definitions, the second 20% portion may include different identifiers and associated definitions than the first, third, fourth, and fifth portions of identifiers and associated definitions, and so on.

The techniques described further include obtaining the first subset of identifiers and associated definitions and the second subset of identifiers and associated definitions from their respective locations indicated by the location information in the manifest, generating a snapshot update of these identifiers and associated definitions, and storing the snapshot update. The snapshot update may be one or more files containing copies of the identifiers and associated definitions.

In further examples, candidate dictionaries can be generated based on a corpus of content and one or more of the generated candidate dictionaries can be implemented for compressing content or can replace a current set of dictionaries being used. The corpus of content can include any suitable set of content including one or more content type, and in one example, the content corpus can comprise a stream of website traffic.

Multiple candidate dictionaries can be generated from a different portion or subset of the full content corpus. The generated dictionaries can be compared by compressing the full corpus of content with each of the candidate dictionaries and identifying quality metrics, an effectiveness score, or the like, for each candidate dictionary based on each respective compression of the full corpus of content. The quality metrics of the candidate dictionaries can be compared and the dictionaries can be ranked or one or more candidate dictionaries can be selected based on various suitable criteria.

In some examples, an implemented dictionary can be monitored and candidate dictionaries can be generated and compared to the currently implemented dictionary based at least in part on quality metrics. Where replacement criteria are met or a replacement threshold is exceeded, a candidate dictionary can be implemented in place of the currently implemented dictionary. In some examples, a company can monitor and/or generate dictionaries for its own purposes. In some examples, a company can provide dictionary generation and/or monitoring as a service to a plurality of customers. In such examples, customers can identify a content corpus, select effectiveness criteria, select a desired dictionary size, select a compression type, and the like.

In the preceding and following description, various techniques are described. For purposes of explanation, specific configurations and details are set forth in order to provide a thorough understanding of possible ways of implementing the techniques. However, it will also be apparent that the techniques described below may be practiced in different configurations without the specific details. Furthermore, well-known features may be omitted or simplified to avoid obscuring the techniques being described.

In one example, as illustrated in FIG. 1, a system 100 can comprise a server 102 and a user device 104, which are operably connected via a network 106. The server 102 can include any suitable configuration of one or more virtual or non-virtual server. Such a server can be implemented in hardware, including a processor, memory, and the like. Although the user device 104 is illustrated in this example as being a tablet computer, in further examples, the server can include various suitable devices including a laptop computer, e-reader, gaming device, desktop computer, wearable computer, home automation system, and the like. The network 106 can comprise any suitable configuration of wired and/or wireless networks including the Internet, a cellular network, a satellite network, a WiFi network, and the like.

As illustrated in FIG. 1, the server 102 can be associated with a set of base dictionaries 108, a set of primary sub-dictionaries 110 and set of secondary sub-dictionaries 112. The user device 104 can also be associated with a set of base dictionaries 108, a set of primary sub-dictionaries 110 and set of secondary sub-dictionaries 112. In various examples, a dictionary can be associated with the server 102 or user device 104 where that dictionary is stored locally or locally accessible to the server 102 or user device 104.

As illustrated in FIG. 1, the server 102 and user device 104 can be associated with matching dictionaries, including base 108 and/or sub-dictionaries 110, 112. For example, the server 102 is shown being associated with a set of base dictionaries 108 that consists of base dictionaries A-N, a set of primary sub dictionaries 110 that consists of base dictionaries A-N, and a set of secondary sub-dictionaries 112 that consists of secondary sub dictionaries A-N. On the other hand, the user device 104 is shown being associated with base dictionaries 108A, 108C, and 108θ, primary sub-dictionaries 110B, 110π, and secondary sub-dictionaries 112C, 112Ω. Accordingly, in this example, both the server 102 and user device 104 are associated with dictionaries 108A, 108C, 110B, and 112C. In other words, these dictionaries are shared or in common.

As discussed in more detail below, the server 102 and user device 104 can communicate more efficiently using a set of dictionaries 101 that are mutually associated with the server 102 and user device 104. In other words, where the server 102 and user device 104 are both associated with copies of one or more of the same dictionary 101, the server 102 and user device 104 can use these one or more shared dictionaries 101 to communicate more efficiently via the network 106.

Additionally, where the server 102 and user device 104 do not both have copies of the same dictionary 101, such a dictionary 101 can be shared via the network 106. For example, in the example of FIG. 1, the user device 104 does not initially have a copy of primary sub-dictionary 110D and secondary sub-dictionary 112F, so these dictionaries 101 can be sent to the user device 104 from the server 102. Sharing additional dictionaries 101 can be desirable in various examples because some sets of one or more dictionaries 101 can provide for more efficient communication compared to other sets of dictionaries 101.

Figure 2:
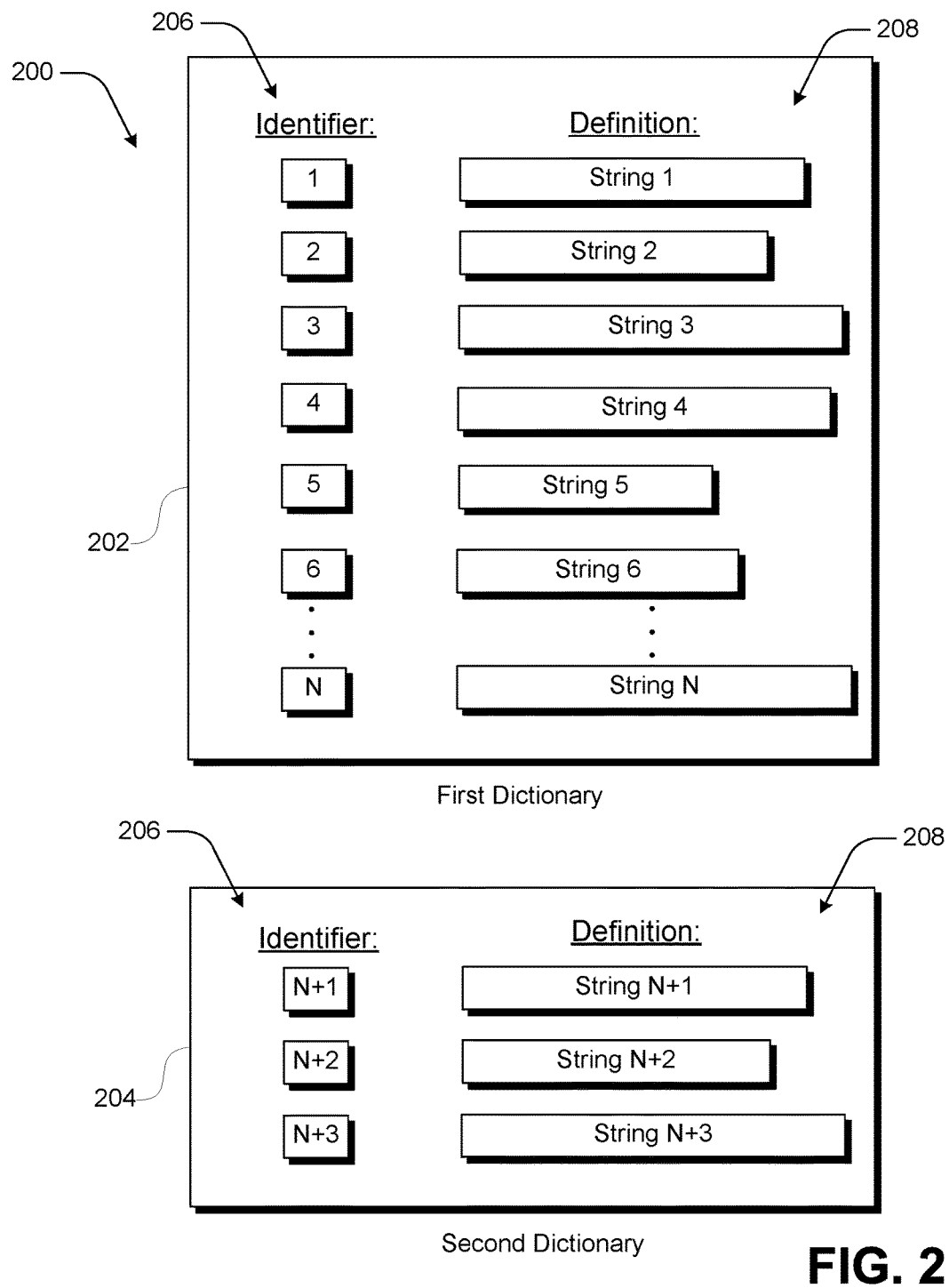
FIG. 2 illustrates an example of base dictionary and a sub-dictionary.

Shared dictionaries 101 and sets of dictionaries 101 can be related in various suitable ways to provide for more efficient communication over a network 106. For example, FIG. 2 illustrates an example dictionary set 200 comprising a primary dictionary 202 and a secondary dictionary 204. Both dictionaries are illustrated as including a set of identifiers 206, which are respectively associated with a definition 208. For example the identifier 206 of "1" corresponds to the definition 208 of "String 1." In various examples, the length or size of identifiers 206 is shorter or smaller than the associated definition 208. Accordingly, communications comprising identifiers 208 can be smaller or shorter than communications using the definitions 208 alone. For example, communication packets sent via Internet Protocol (IP) can have a smaller payload by using identifiers 208, which can be decoded at a receiver using a shared dictionary that defines which identifiers 206 correspond to given definitions 208.

In various examples discussed in this disclosure (e.g., FIGS. 1 and 2), one or more shared dictionaries 101 can be used to encode and decode communications between a server 102 and user device 104. In one example, a single shared base dictionary 108 can be used by the server 102 and user device 104 to encode and decode communications. However, in further embodiments, a single shared base dictionary 108 and one or more shared sub-dictionaries (e.g., one or more primary sub-dictionary 110 and/or secondary sub-dictionary 112) can be used to encode and decode communications between the server 102 and user device 104.

In some examples, a primary sub-dictionary 110 can be dependent upon one or more base dictionary 108. For example, as illustrated in FIG. 2, the first dictionary 202 can be a base dictionary 108 having 1–N identifiers 206 with corresponding 1–N string definitions 208, where "N" represents a positive integer. The second dictionary 204 can be a primary sub-dictionary 110 that is dependent on the first dictionary 202, which includes N+1, N+2, and N+3 identifiers 206 with corresponding N+1, N+2, and N+3 string definitions 208. In other words, in this example, the second dictionary 204 can be inoperable alone and the set of the first and second dictionary 202 can be required to encode and decode communications between the server 102 and user device 104. However, if only the first dictionary 202 is shared by the server 102 and user device 104, the first dictionary 202 alone can be used to encode and decode communications between the server 102 and user device 104.

Dictionaries 101 can be interdependent in various suitable ways in accordance with further examples. Referring to FIG. 1, in one example, primary sub-dictionary 110B can be dependent upon base dictionary 108A and secondary sub-dictionary 112C can be dependent upon primary sub-dictionary 110B. In other words, the shared set of base dictionary 108A alone; or the shared set of set of base dictionary 108A and primary sub-dictionary 110B; or the shared set of base dictionary 108A, primary sub-dictionary 110B, and secondary sub-dictionary 112C would be operable to encode and decode communications between the server 102 and user device 104. However, other shared sets of base dictionary 108A, primary sub-dictionary 110B, and secondary sub-dictionary 112C would be inoperable to encode and decode communications between the server 102 and user device 104.

Dictionaries 101 can have multiple dependencies in various examples. In one example, primary sub-dictionary 110B can depend from either of base dictionary 108A or base dictionary 108C. In another example secondary sub-dictionary 112C can depend from either of primary sub-dictionary 110B and primary sub-dictionary 110D. Additionally, although FIG. 1 illustrates only primary and secondary sub-dictionary 110, 112 levels, in further examples, there can be any suitable number of levels of sub-dictionaries, including sub-dictionaries that are tertiary, quaternary, quaternary, quinary, senary, septenary, octonary, nonary, or the like.

As illustrated in FIG. 2, a dictionary set 200 can comprise a set of consecutively numbered identifiers 206 that each correspond to a string definition 208. However, in further examples, identifiers 206 may not be consecutively numbered or otherwise ordered. Additionally, identifiers 206 may comprise any suitable plurality of numbers, letters, characters, or the like. String definitions 208 can comprise any suitable plurality of numbers, letters, characters, or the like. In some examples, a string can comprise binary, text (e.g., one or more word, sentence), a uniform resource identifier (URI), a media access control (MAC) address, a portion of code (e.g., HTML, Java script), code corresponding to a portion of an image, code corresponding to a portion of an audio recording, code corresponding to a portion of a video, or the like.

In further examples, a definition 208 may not be a string of letters, number and/or characters. For example, a definition can include an image, audio data, video data, a webpage snapshot, or the like. In one example, a dictionary can reference cached files or other content that is stored on a user device and/or server.

As illustrated in FIG. 2, in some examples, a second dictionary 204 can add additional identifiers 206 and definitions 208 to the set of identifiers 206 and definitions 208 present in a first dictionary 202. More specifically, this example illustrates the first dictionary 202 having 1–N identifiers 206 that respectively correspond to 1–N string definitions 208 with the identifier 206 of N+1, N+2, and N+3 being added that respectively correspond to N+1, N+2, and N+3 string definitions 208.

However, in further examples, further dictionaries can modify definitions of a base dictionary or of another dictionary from which the dictionary depends. Referring to FIG. 1, a primary sub-dictionary 110 can modify one or more definition of a base dictionary 208. In other words, a primary sub-dictionary 110 can replace one or more definition of a base dictionary 208 with a new definition and/or add new identifiers and definitions. Similarly, a secondary sub-dictionary 110 can modify one or more definition of a base dictionary 208 and/or a primary sub-dictionary 110.

In some examples, a dictionary can comprise a plurality of definitions without identifiers explicitly being defined by the dictionary. Identifiers can reference various portions of a dictionary based on a structure of the dictionary. For example, a dictionary can comprise a string of characters such as numbers, letters, and the like, and an identifier can include a beginning character and an ending character (e.g., a definition could include "characters 1314-1397"). In another example, a dictionary can include a plurality of rows with each row including a string of characters and an identifier can include a beginning row and character number and an ending row and character number. Additionally, an identifier can include a modifier of such one or more identified portion of the dictionary, including a repeat, filter, transpose, subtraction, multiplication, addition, or the like. For example, a definition can include "characters 1314-1397, and repeat characters 1388-1397 twenty times."

Accordingly, in various examples, definitions can be overlapping or include some or all of the same portions of a dictionary as other definitions. For example, where a dictionary includes the string "HELLOWORLD" a first definition could include the full string "HELLOWORLD," a second definition could include the string "HELLO," a third definition could include the string "WORLD," and the like.

Figure 3:
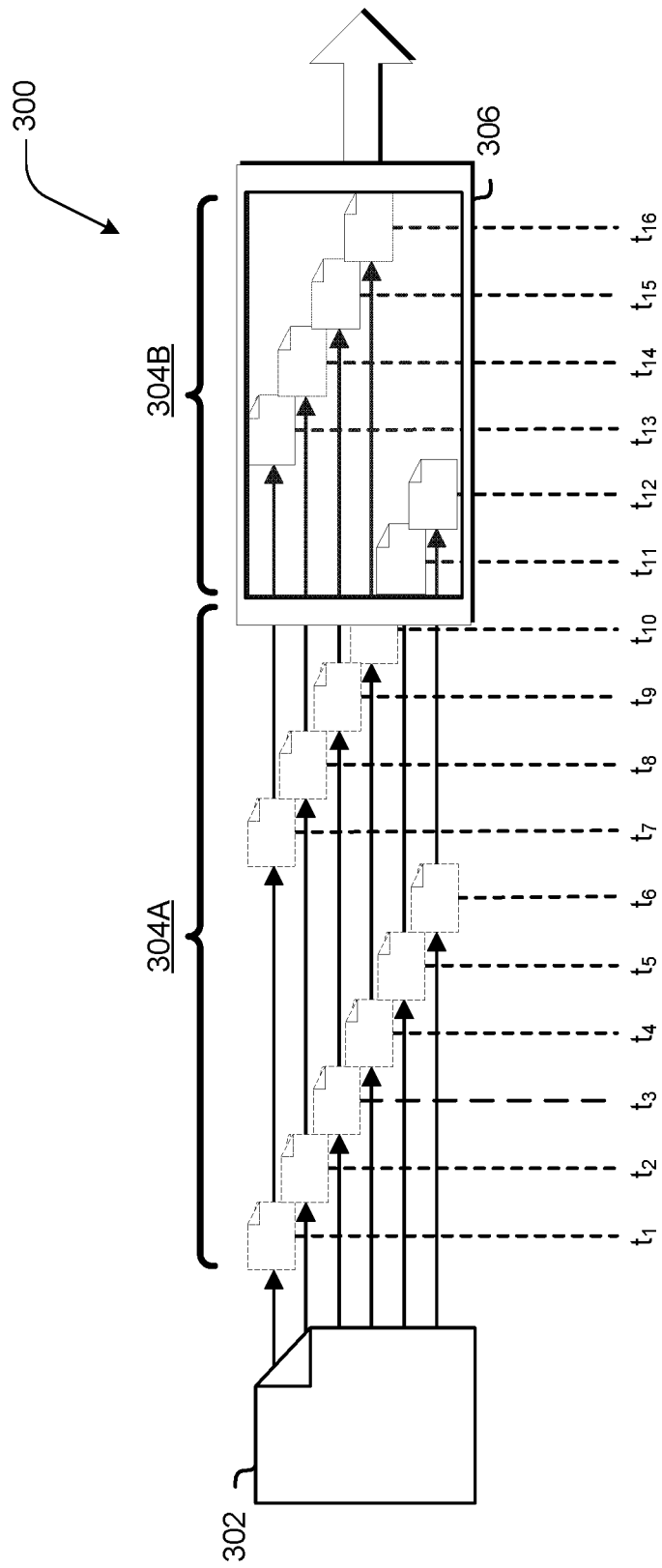
FIG. 3 illustrates an example of snapshot updates of a dictionary and a sliding window in accordance with an example.

Additionally, in further examples, sub-dictionaries can be generated as snapshot dictionaries that serve to capture changes to one or more base and/or sub dictionary over time. For example, FIG. 3 depicts a technique for snapshotting a changing base dictionary 302 (or set of dictionaries) by capturing snapshot updates 304A-304B over time. In some examples, a "snapshot update" may refer to copy of a portion of a dictionary at a particular point in time. A snapshot update of the present disclosure may include incremental data (which may also be referred to as a "change set") that includes data that is new or has changed since a previous snapshot (full snapshot or snapshot update) was captured.

In some examples, the incremental data is caused to be pushed from the dictionary by an administrator or user of the dictionary (e.g., via an application programming interface call) to one or more system storing the snapshots of the present disclosure, which can include a user device, server, or the like. In other implementations, the system performing the snapshot updating is authorized and configured to copy the incremental data directly from the dictionary on its own.

The snapshot update may further include a "proportional" portion (which may be referred to as a "mandatory set") which may include a copy of a certain portion or proportion of the entire dictionary. In other examples, the system performing the snapshot updating is configured to obtain the proportional portion directly from the dictionary. Additionally or alternatively, in some implementations, the system performing the snapshot updating can obtain the proportional portion from previous snapshot updates. In some examples, the "proportion" of the proportional snapshot can vary from snapshot to snapshot.

Each of the snapshot updates 304A-304B can be seen to have been captured at a different point in time. For example, the first snapshot update of the snapshot updates 304A-304B can be seen as being captured at time $t_1$, the second snapshot update of the snapshot updates 304A-304B can be seen as being captured at time $t_2$, and so on up to the most recent captured snapshot of the snapshot updates 304A-304B captured at time $t_{16}$. In some examples, the term "snapshot depth" (which may also be referred to simply as "depth") may refer to how many snapshot updates 304A-304B, at most, will be needed for obtaining the base dictionary 302 at a current state; in other words, the snapshot depth reflects the size of the sliding window 306, and may be a predetermined value that acts an upper limit to the number of active snapshots 304B in the sliding window 306. The representation of FIG. 3 shows one example 300 of the present disclosure having a snapshot depth of six; that is, the example 300 is configured such that the current state of the changing base dictionary 302 can be obtained using only six consecutive snapshots of the snapshot updates 304A-304B. The sliding window 306 indicates the active snapshot updates 304B; that is, the six most recent snapshot updates of the depicted example.

Data for the changing base dictionary 302 may reside in one physical storage device (e.g., a hard disk) or may reside on one or more partitions distributed across multiple storage devices. As an example the changing base dictionary 302 may be a dictionary of block-level storage residing on one or more block-level storage devices of a block level storage service provided by a computing resource service provider. The block-level storage devices may, for instance, be operationally attached to virtual computer systems provided by a virtual computer system service of the computing resource service provider to serve as logical storage units (e.g., virtual drives) for the computer systems. A block-level storage device may enable the persistent storage of data used/generated by a corresponding virtual computer system, whereas the virtual computer system service may only provide ephemeral data storage. As discussed in more detail below a base dictionary 302 (and/or one or more sub-dictionary) can change over time for various reasons. For example, changing a base dictionary 302 over time can make the base dictionary 302 more effective, efficient, compressive, or the like.

As shown in FIG. 3, the example 300 has a snapshot depth of six, and thus each of the snapshot updates 304A-304B can be seen to comprise at least $\frac{1}{6}^{th}$ of the changing base dictionary 302. For example, the snapshot update at time $t_1$ may include the first sixth of the base dictionary 302. Likewise, the snapshot update at time $t_2$ may include the second sixth of the base dictionary 302. The snapshot update at time $t_2$ may also include any changes to the first, third, fourth, fifth, or sixth portions of the base dictionary 302 that have occurred since time $t_1$. Similarly, the snapshot update at time $t_3$, may include the third sixth of the dictionary 302, as well as any changes to the first, second, fourth, fifth, or sixth portions of the dictionary 302 that have occurred since time $t_2$.

This process may continue up to the snapshot update at time $t_6$, which may include the final sixth of the base dictionary 302, as well as any changes to the first, second, third, fourth, and fifth portions of the base dictionary 302 that have occurred since time $t_5$. Note that at this point in time, the combination of each of the snapshot updates $t_1$ through $t_6$ covers the entire base dictionary 302. Note as well, that at this point in time the sliding window 306 would comprise the snapshots of time $t_1$ through $t_6$.

Note also that, the snapshot update captured at time $t_7$ once again captures the first sixth of the dictionary 302. This snapshot update captured at time $t_7$ may also include any changes to the second, third, fourth, fifth, and sixth portions of the dictionary 302 that have occurred since time $t_6$. Because the snapshot update captured at time $t_7$ may include at least the first portion of the dictionary 302, the snapshot update captured at time $t_1$ may be redundant or obsolete. In some implementations, the snapshot update captured at time $t_1$ can subsequently be deleted to conserve space. Note that, in some of these implementations, these historical snapshot updates 304A (i.e., snapshot updates outside the sliding window 306) are retained until a customer owner of the dictionary 302 orders their deletion, whereas in other implementations, these historical snapshot updates 304A are deleted automatically once they are outside the sliding window 306.

In still other implementations, a certain number of most recent historical snapshot updates may be retained, or each historical snapshot updates may be retained for a certain period of time (e.g., five days) before being deleted, or may be retained until the cumulative size of the historical snapshot updates 304 exceeds a certain threshold upon which time select historical snapshot updates may be deleted (e.g., oldest first) to keep the space requirements for the historical snapshot updates below the threshold. Thus, at time $t_7$ the sliding window 306 would cover the snapshots of time $t_2$ through $t_7$.

The sliding window 306 is simply intended to illustrate the active snapshot updates that comprise the full changing dictionary 302. The sliding window 306 would normally comprise the most recent snapshot updates up to the maximum snapshot depth, which in the example 300 would be six, or up to the last full snapshot, whichever occurs first. For example, at time $t_0$ (not depicted), a full snapshot (i.e., a capture of all data of the dictionary; also referred to as a base snapshot) may have been taken of the dictionary. In this example at time $t_1$, the sliding window may include the snapshot update captured at time $t_1$ plus the full snapshot.

Similarly, the sliding window at time $t_5$ may include the snapshot updates at time $t_1$ through time $t_5$ plus the full snapshot. However, when the snapshot update is captured at time $t_6$ all of the data of the dictionary 302, in its most up-to-date version, should be included in the accumulated snapshot updates captured from time $t_1$ through $t_6$, rendering the full snapshot at time $t_0$ redundant or obsolete.

Thus, in the example 300 the most recent snapshot update was captured at time $t_{16}$, and, as illustrated, the sliding window 306 now includes the snapshot updates captured from time $t_{11}$ through $t_{16}$. This sliding window 306 also means that the snapshot updates captured from time $t_1$ through time $t_{10}$ (including, any full snapshots captured at that time such as at time $t_0$) should be redundant or obsolete, and in some implementations are deleted.

Note additionally that a full snapshot can be constructed from the active snapshot updates 304B. For example, at a time $t_{17}$ (not shown) a full snapshot may be assembled by first obtaining the oldest snapshot update of the active snapshot updates 304B (the snapshot update captured at time $t_{11}$), then combining that snapshot with the next oldest snapshot update of the active snapshot updates 304B (the snapshot update captured at time $t_{12}$), then combining with the next oldest snapshot update of the active snapshot update 304B (the snapshot update captured at time $t_{13}$), and so on until finally combining the most recent snapshot update of the active snapshot updates 304B (the snapshot update captured at time $t_{16}$). The dictionary 302 may be restored to the state it was in at a time of its most recent snapshot update in a similar manner.

Note that there are various implementations that may be used to generate a full snapshot or obtain a current state of a dictionary from its active snapshot updates than the one described above. In the manner described above, by starting with the oldest of the active snapshot updates data in an older snapshot that changed and the change captured in a more recent snapshot, may be naturally overwritten by the updated data. However, another technique may be to start with the most recent snapshot update (e.g., the snapshot update captured at time $t_{16}$) and work backwards to the oldest of the active snapshot updates, but skipping over any data in an older snapshot update that has already been included in a more recent snapshot update.

Still another technique may be to generate a manifest that includes a reference to every identifier and/or definition of the dictionary 302 and the location where the most recent version of the identifier and/or definition can be found in the active snapshot updates 304B, and then generate a full snapshot (which may also be referred to as a full re-base snapshot) by a selectively obtaining only the most recent versions of the identifier and/or definition from the particular snapshot update(s) hosting them. Obtaining the current state of the dictionary 302 may be performed in a similar manner. Note as well, that a partial current state obtaining of a dictionary 302 may be performed by locating the identifier and/or definition to be restored within the manifest, and selectively obtaining the most recent versions of identifier and/or definition from their respective active snapshot updates 304B.

In some implementations each of the snapshot updates 304A-304B have an associated set of permissions that grants access (e.g., read access, write access, etc.) to that particular snapshot update, such that a user or other entity having a first set of permissions granting access to first snapshot update is unable to access a second snapshot update unless the user or other entity also has a second set of permissions granting access to the second snapshot update. In some examples, one or more of the snapshot updates 304A-304B share a set of permissions that grant access to the one or more of the snapshot updates 304A-304B. In this manner, network security may be improved because users and other entities can be assigned permissions only to the actual snapshot they need to access.

Figure 4:
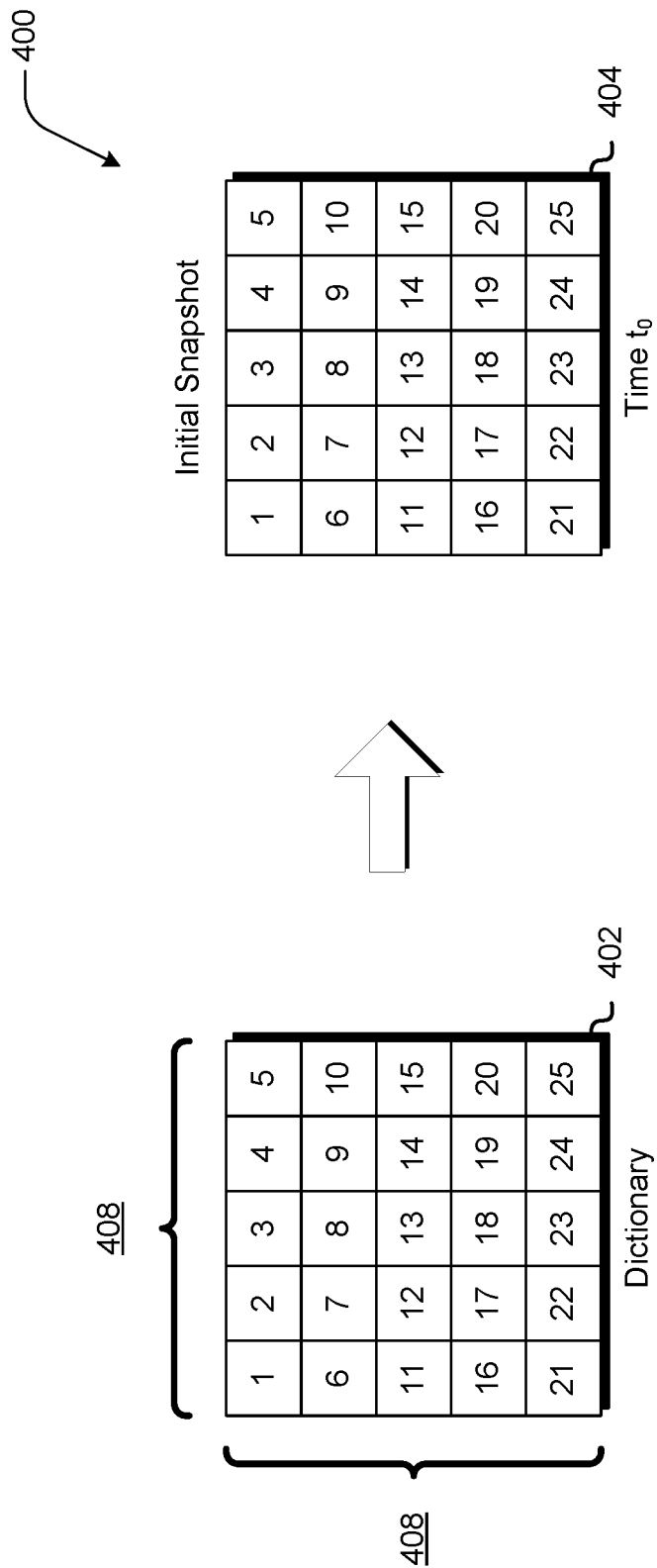
FIG. 4 illustrates an example of a dictionary and an initial snapshot in accordance with an example.

FIG. 4 depicts a representation 400 of a dictionary 402 and an initial snapshot 404 of an example of the present disclosure. The dictionary 402 depicted in FIG. 4 is comprised of 25 chunks 408 of data, from chunk 1 at position 1 to chunk 25 at position 25. For purposes of this example, each of the chunks 408 may include a portion of a dictionary or may include one or more identifiers and/or definitions. The dictionary 402 may be a dictionary similar to the dictionary 302 described in conjunction with FIG. 3. FIG. 4 also illustrates an initial snapshot 404 at a time $t_0$. The initial snapshot 404 may be at first snapshot of the dictionary 402, may be a re-based snapshot (as described above in conjunction with FIG. 3), or any other full snapshot of the dictionary 402. That is, each of the chunks 408 are included in the initial snapshot 204 in a same version as they were in the dictionary 402 at the time represented by time $t_0$. FIG. 4 represents an initial state of the dictionary 402 and the dictionary 302 of FIG. 3 prior to capturing any of the snapshot updates depicted in FIG. 3.

Figure 5:
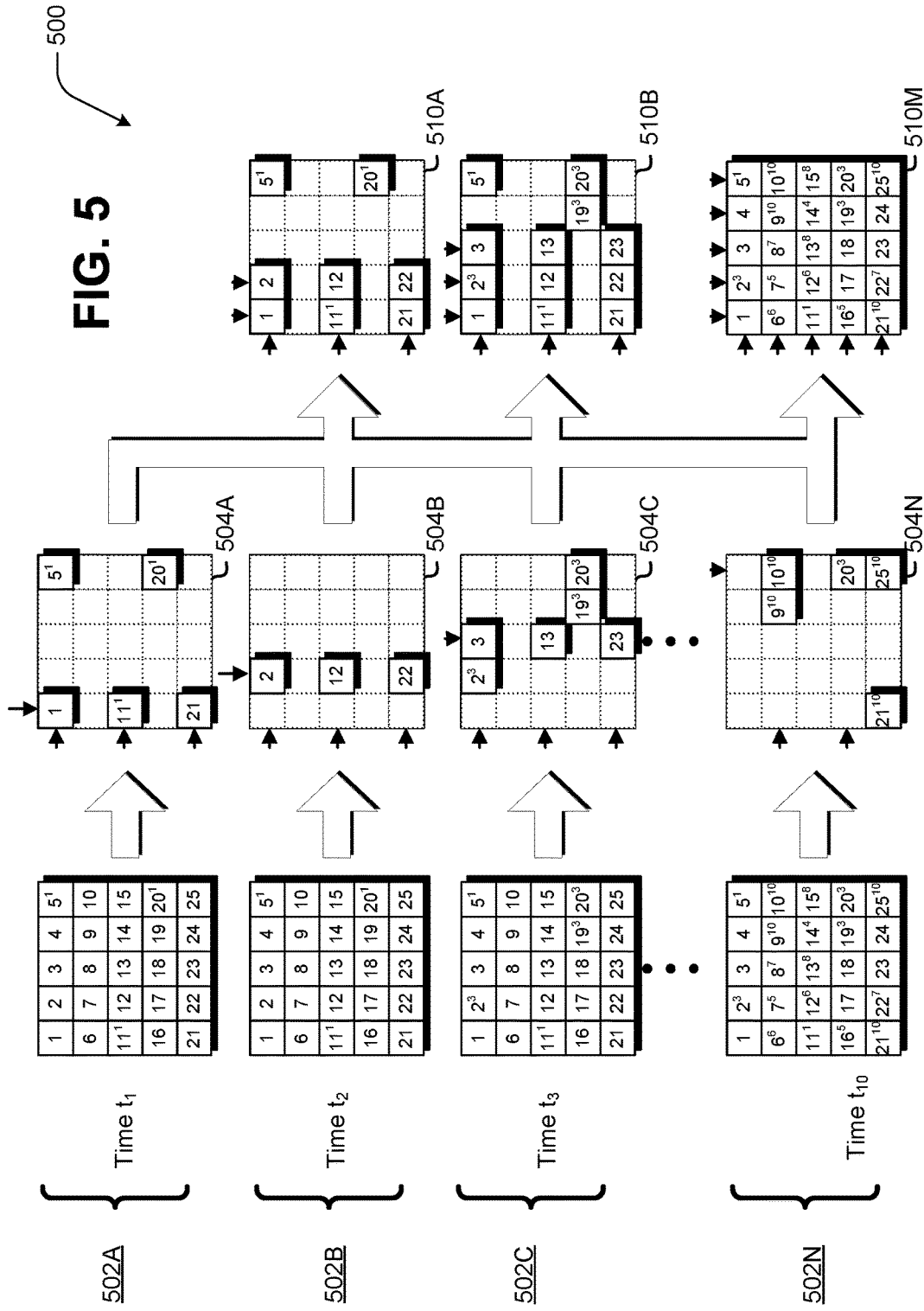
FIG. 5 illustrates an example of a dictionary and snapshot updates in accordance with an example.

Similar to FIG. 4, FIG. 5 depicts representations 500 of a dictionary as data of the dictionary (e.g., dictionary portions, identifiers and/or definitions) changes and as snapshot updates 504A-504N are taken over time. For example, dictionary 502A represents the dictionary at time $t_1$, dictionary 502B represents the dictionary at time $t_2$, dictionary 502C represents the dictionary at time $t_3$, and dictionary 502N represents the dictionary at time $t_{10}$. The dictionary may be a dictionary similar to the dictionaries 108, 110, 112, 202, 204, 302, and 404 of FIGS. 1-4 respectively. The representations 500 depict an example of the present disclosure with a maximum snapshot depth of 10; in other words, a full snapshot or a full restore of the dictionary may be generated using no more than 10 consecutive snapshot updates of the present disclosure.

Starting at time $t_1$, it is seen that chunks 5, 11, and 20 have changed since an initial state (e.g., a state of the dictionary at time $t_0$ as depicted in FIG. 4). As part of the first snapshot update, these changed chunks may naturally be included in the incremental portion of the first snapshot update 504A. Additionally, at time $t_1$ a proportion of the entire dictionary may also be included in the first snapshot update 504A, the proportion being based at least in part on the maximum snapshot depth, which in the case of the representations 500 would be 1/10 or 10%. This may be achieved, for example, by incrementing a snapshot counter, taking the modulus of the snapshot depth (being 10, in that example) of an identifier or order number in the manifest for each chunk in the manifest, and including the chunks whose modulus 10 matches the modulus 10 of the snapshot counter. In other words, at time $t_1$ the snapshot counter may be 1, and 1 mod 10 is 1.

Assuming the numbers of the chunks in the dictionary 502A correspond to identifiers for the particular chunks, the modulus of the identifier for chunk 1 of the dictionary 502A, 1 mod 10 is 1, which matches the modulus of the snapshot counter, and therefore chunk 1 would be included in the proportional portion of the first snapshot update. However, the modulus for chunk 2 of dictionary 502A, 2 mod 10 is 2, which does not match the modulus 10 of the snapshot counter, therefore chunk 2 would be excluded from the proportional portion of the first snapshot update, and so on.

Skipping down, however, the modulus for chunk 11 a dictionary 502A, 11 mod 10 is 1, which again matches the modulus 10 of the snapshot counter so chunk 11 would normally be included in the proportional portion of the first snapshot update. Chunk 21 is included for the same reason. The black arrows in the snapshot updates 504A-04N are intended to highlight the chunks corresponding to the proportional portion. Note though, that chunk 11 has also been modified since the initial state, as indicated by the superscript of the snapshot counter ($^1$). Thus, chunk 11 would have been already included in the incremental portion of the first snapshot update.

Although examples in the present disclosure describe determining which chunks (or sets of identifiers and/or definitions) to include in the proportional portion based at least in part on a modulus of some value associated with the chunk (or one or more identifiers and/or definitions), such as an identifier or counter, other methods are contemplated as well. For example, at a first time, a first 1/Nth of chunks in the dictionary may be included in the proportional portion, where N is the snapshot depth, and at a second time the next 1/Nth of chunks (or one or more identifiers and definitions) in the dictionary may be included in the proportional portion, and so on. This may continue until, after including the last 1/Nth, the next snapshot update includes the first 1/Nth of chunks (or one or more identifiers and/or definitions) again, and so on.

An alternative may be to base the snapshot depth on time. For example, the proportional portion may include as many chunks (or one or more identifiers and/or definitions) as can be copied to the snapshot location within a certain period of time (e.g., 1 minute, 5 minutes, 60 minutes, one day, one week, one month, etc.). The certain amount of time may be based at least in part on the frequency that snapshot updates are being performed. For example, if snapshot updates are performed (e.g., by instruction from a customer owner) on the dictionary every 5 minutes, the proportional portion may include only as many chunks as can be copied within 2 minutes, in order to provide enough time to copy the incremental portion before the next snapshot update is performed.

In some implementations, the version of chunk 11 included in the proportional portion of the first snapshot update would be the previous version (i.e., from the initial snapshot at $t_0$); that is, the first snapshot update would include both the previous version of chunk 11 and the current version of chunk 11. In some implementations, the incremental portion of the snapshot update is determined before the proportional portion. In other implementations, the proportional portion of the snapshot update is determined before the incremental portion. In either implementation, a duplicate of a chunk that has already been included in a portion of the snapshot update may be excluded to avoid duplication. That is, in these implementations the set of dictionary portions or the set of identifiers and corresponding definitions in the incremental portion and the set of dictionary portions or the set of identifiers and corresponding definitions in the proportional portion may be disjoint from each other (i.e., they do not share the same identifiers and corresponding definitions or do not share the same dictionary portions).

However, in other implementations, such as where each portion of the snapshot update are generated and stored separately but in association with each other, duplicate chunks may be retained. In other words, in these other implementations, the set of dictionary portions or the set of identifiers and corresponding definitions in the incremental portion, and the set of dictionary portions or the set of identifiers and corresponding definitions in the proportional portion may intersect at times. Thus, as depicted in the representations 500, chunks 1, 5, 11, 20, and 21 may be included in the incremental and proportional portions of the first snapshot update 504A.

Moving on to the dictionary 502B at time $t_2$, it can be seen that no updates have occurred to any chunks between time $t_1$ and time $t_2$. Thus, the second snapshot update 304B only includes a proportional portion (indicated by the black arrows). That is, the snapshot counter has been incremented to two, meaning that the modulus 10 of chunks 2, 12, and 22 matches the modulus 10 of the snapshot counter, and thus chunks 2, 12, and 22 will be included in the second snapshot update at time $t_2$. Snapshot window 510A is intended to illustrate the chunks collectively stored in the first snapshot update and the second snapshot update.

Proceeding to time $t_3$, it can be seen that chunk 2 has changed between time $t_2$ and time $t_3$, as indicated by the superscript of the snapshot counter ($^3$), as well as chunks 19 and 20. Thus, chunks 2, 19, and 20 will be included in the incremental portion of the third snapshot update, and chunks 3, 13, and 23 will be included in the proportional portion (indicated by the black arrows) of the third snapshot update because the modulus 10 of the identifiers of these chunks match the modulus 10 of the snapshot counter. Note that chunks 2 and 20 have already been included in prior snapshot updates (i.e., the second snapshot update and the first snapshot update respectively). Because chunks 2 and 20 in the third snapshot update reflect the most recent change to those respective chunks, during a re-base or during a restore of a dictionary from the snapshot the older versions of these respective chunks (i.e., from the second snapshot update and the first snapshot update) may be omitted from the restore, or, alternatively, may be overwritten by the more recent version of those respective chunks in the third snapshot update.

In still other implementations, the older versions of respective chunks are deleted from their respective snapshot updates (i.e., the second snapshot update and the first snapshot update). In even other implementations, the versions of chunks 2 and 20 included in the proportional portion of the first snapshot update would be the previous versions (i.e., chunk 2 from the initial snapshot at $t_0$ and chunk 20 from the first snapshot update at $t_1$); that is, the third snapshot update would include both the previous version of chunks 2 and 20 and the current versions of chunks 2 and 20. Snapshot window 510B consequently illustrates how, with each succeeding snapshot update, the snapshot updates collectively store more of the state of the dictionary 502C.

The process may continue for each snapshot update as described above such that, at time $t_{10}$, it can be seen that, for the dictionary 502N, chunk 5 was last modified prior to time chunks 2 and 20 were last modified between time $t_2$ and $t_3$, chunk 14 was last modified between time $t_3$ and $t_4$, chunks 7 and 16 were last modified between time $t_4$ and $t_5$, chunks 6 and 12 were last modified between time $t_5$ and $t_6$, chunks 8 and 22 were last modified between time $t_6$ and $t_7$, chunks 13 and 15 were last modified between time $t_7$ and $t_8$, and chunks 9, 10, 21, and 25 were last modified between time $t_9$ and $t_{10}$. It can also be seen that chunks 1, 3, 4, 17, 18, 23, and 24 have not changed at all since the initial snapshot. Thus, at this time it is seen that chunks 9, 10, 21 and 25 would be included in the incremental portion of the tenth snapshot update 504N, and chunks 10 and 20 would be included in the proportional portion of the tenth snapshot update 504N (with duplicate chunk 10 discarded or not discarded from one of the portions, or previous version of chunk 10 included in the proportional portion, depending on the implementation).

Note that chunk 20, which would be included in the proportional portion of the $10^{th}$ snapshot update 504N has not changed since time $t_3$, and thus was already included in the third snapshot update, which is still within the current snapshot window. Consequently, in some implementations, chunk 20 can be excluded from the $10^{th}$ snapshot update because, during a full re-base or when obtaining the current state of the dictionary 502N, the most recent version of chunk 20 can still be obtained from a previous snapshot (i.e., the third snapshot update) within the current snapshot window. Furthermore, it can be seen now that, because the snapshot window 510M now includes as many snapshot updates as the maximum snapshot depth of 10, the totality of all of the active snapshot updates 504A-504N in the snapshot window include all of the chunks required for a full re-base or a full restore of the state of the dictionary 502N at time $t_{10}$.

In some implementations, snapshot updates can be performed on-demand, such as in response to a request from a dictionary administrator or other entity authorized to request a snapshot of the dictionary. In other additional or alternative implementations, snapshot updates occur in response to a particular event. For example, a snapshot update may be triggered to occur after every 1,000 writes to the dictionary being snapshotted. As another example, a snapshot update may be triggered to occur when a defined number of changes and/or additions have been made to the dictionary portions or identifiers and/or definitions of the dictionary.

In another additional or alternative implementation, a snapshot update that is scheduled or instructed to be performed can be postponed upon the occurrence of a particular event and resumed upon the occurrence of another event. For example, if a computing device hosting the dictionary detects that an operating temperature has exceeded a threshold temperature, a schedule snapshot update may be postponed until the operating temperature is detected to have dropped below the threshold temperature.

Figure 6:
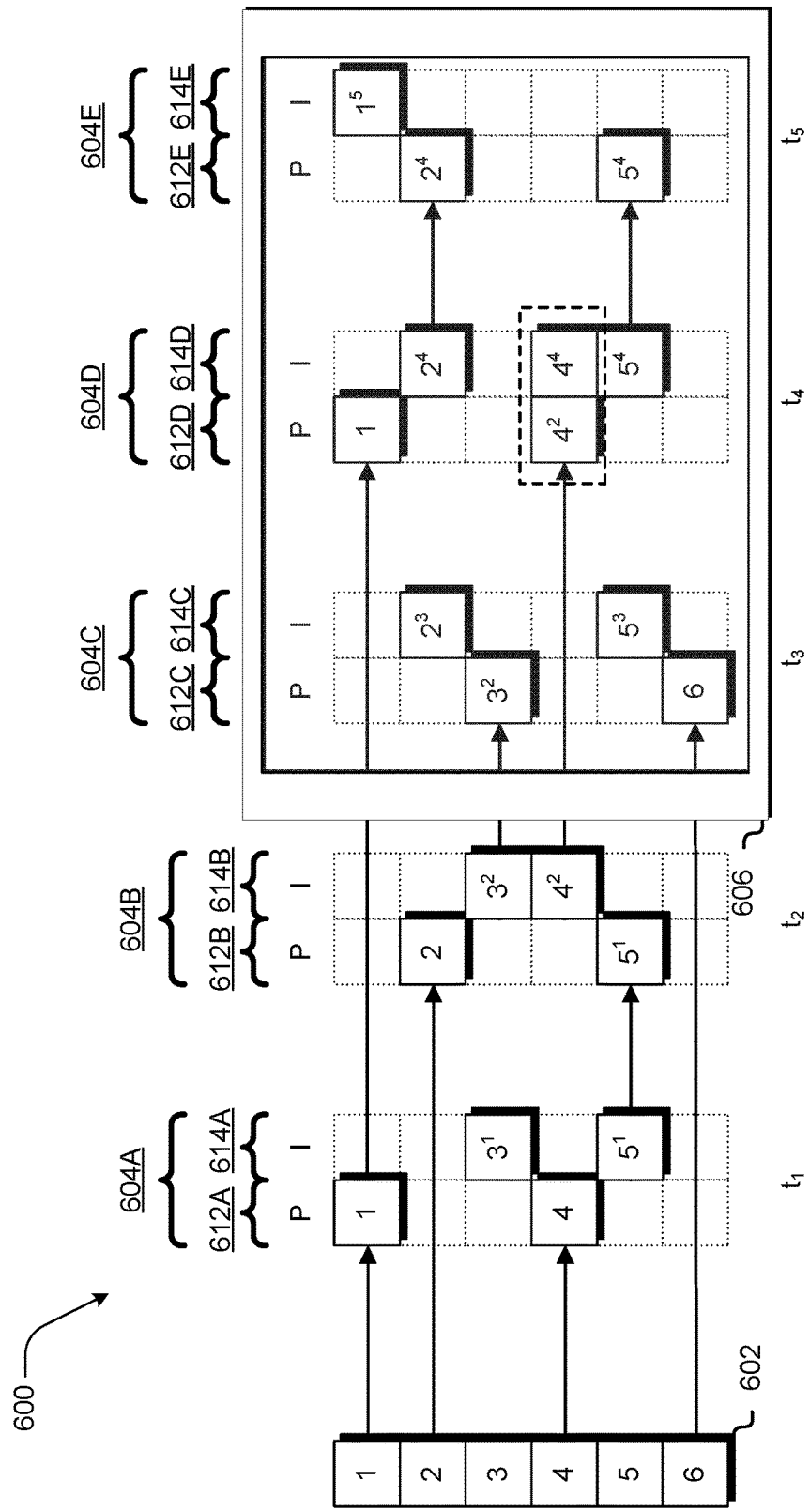
FIG. 6 illustrates an example of snapshot updating and a sliding window in accordance with an example.

FIG. 6 illustrates a representation 600 of an example of the present disclosure. Specifically, FIG. 6 depicts making snapshot updates in accordance with an example of the present disclosure of a dictionary 602 divided into six data portions, where each data portion may comprise one or more dictionary portions or one or more identifiers and/or corresponding definitions. The representation 600 depicts the dictionary 602 and five snapshot updates 604A-604E, where each snapshot update includes a proportional portion 612A-612E and an incremental portion 614A-614E. The maximum snapshot depth of the example depicted in FIG. 6 is three, represented by the snapshot window 606 showing the three most recent snapshot updates 604C-604E as the active snapshots.

At time $t_1$, a first full manifest may be created. The manifest indicates locations where data portions may be found, such that the manifest can act as a map to the versions of data portions at time $t_1$. At time $t_1$, since no previous snapshot updates exist, the locations of the data portions will likely all be from the dictionary 602 or an initial snapshot at time $t_0$ (not shown). As can be seen, at time $t_1$ (snapshot count=1), data portions 1 and 4 are included in the first proportional portion 612A (modulus 3 of the snapshot count equals modulus 3 of 1 and 4), and data portions 3 and 5 have been modified since the initial snapshot at time $t_0$ and are therefore included in the first incremental portion 614A of the first snapshot update 604A. A first partial manifest (also referred to as a "change set") may be generated for the first snapshot update 604A to reflect the data portions that are included in the first snapshot update 604A; alternatively the first full manifest may be updated to reflect these locations. These manifests may be stored in association with the first snapshot update 604A (e.g., in a same directory or in a database record having information indicating the storage location of the first snapshot update 604A).

At time $t_2$, a second full manifest may be created. The second full manifest may indicate that the most recent version of data portions 1 and 5 are located in the first snapshot update 604A, with the rest being located on the dictionary 602 or in the initial snapshot at time $t_0$. Thus, at time $t_2$ (snapshot count=2), data portions 2 and 5 are included in the second proportional portion 612B (modulus 3 of the snapshot count equals modulus 3 of 2 and 5). With a snapshot depth of three, the first and second snapshot updates 604A-604B are within the sliding window 606 at this time, and it can be seen that data portion 5 is included in both snapshots.

In some examples, data portion 5 is removed from the first snapshot update 604A to conserve space, in other examples data portion 5 is omitted from the second snapshot update 604B to conserve space (however, care must be taken to ensure that data portion 5 is carried forward as the sliding window 606 passes the first snapshot update 604A), and in still other examples data portion 5 is retained in both the first and second snapshot updates 604A-604B. It can be seen that data portions 3 and 4 have changed since time $t_1$, and therefore will be included in the second incremental portion 614B of the second snapshot update 604B. A second partial manifest may be generated for the second snapshot update 604B to reflect the data portions that are included in the second snapshot update 604B; alternatively, the second full manifest may be updated to reflect these locations. These manifests may be stored in association with the second snapshot update 604B.

At time $t_3$, a third full manifest may be created indicating that the most recent version of data portion 1 is still in the first snapshot update 604A, most recent versions of data portions 3 and 4 are in the second snapshot update 604B, and the most recent version of data portion 6 is still on the dictionary 602 or in the initial snapshot at time $t_0$. At time $t_3$ (snapshot count=3), data portions 3 and 6 are included in the third proportional portion 612C. Note that, depending on the particular implementation, the data portion 3 may be obtained from the second snapshot update 604B, the dictionary 602, or omitted from the third proportional portion 612C since it is currently included in the second snapshot update 604B which is still inside the sliding window 606.

It can be seen that data portions 2 and 5 have changed since time $t_2$, and therefore will be included in the third incremental portion 614C of the third snapshot update 604C. Note that, at this point, due to the maximum snapshot depth being three, the sliding window 606 now no longer includes the initial snapshot at time $t_0$. In some implementations, the full initial snapshot at time $t_0$ can be deleted, as the most current versions of the data portions should be found within the sliding window 606. A third partial manifest may be generated or the third full manifest may be updated in a similar manner as described above.

In a similar manner, at time $t_4$ the fourth proportional portion 612D of the fourth snapshot update 604D will include data portions 1 and 4. Note that because the initial snapshot at time $t_0$ is no longer included in the snapshot window 606, data portion 1 may be retrieved from the first snapshot update 604A. In alternate examples, rather than retrieving data portion 1 from snapshot update 604A, data portion 1 is obtained directly from the dictionary. In these examples, obtaining the proportional portion directly from the dictionary may be preferable in order to reduce error propagation. For example, if data corruption occurred during a copy operation from an earlier snapshot, that data corruption might be inadvertently copied into future snapshot updates.

However, by obtaining the proportional portion directly from the dictionary, the snapshot update will at least have the proportional portion in the state it is on the dictionary. Note however, obtaining the proportional portion directly from the dictionary may be more taxing on the resources of the computing system hosting the dictionary. In some implementations, the proportional portion can alternate obtaining the proportional portion from a previous snapshot and obtaining the proportional portion from the dictionary (i.e., redundant copy) according to a schedule or according to resource demand. For example, a daily proportional portion may be obtained from a previous snapshot Sunday through Friday, but every Saturday it is obtained directly from the dictionary (in this manner data may be periodically refreshed). On the other hand, in another example, proportional portion may be obtained from directly from the dictionary unless resource usage/demand for the dictionary exceeds a threshold, whereupon the proportional portion may be obtained from a previous snapshot instead.

Note that in examples of the present disclosure, data portions are obtained from the dictionary by an administrator of the dictionary causing the data portions to be pushed to the system storing the snapshots, such as through an application executing in a virtual machine instance attached to the dictionary or otherwise by an instruction through an application programming interface. Alternatively, in some implementations, the system performing the snapshotting process of the present disclosure accesses the dictionary on its own and copies the data portions directly from the dictionary.

As for the fourth incremental portion 614D, it is seen that data portions 2, 4, and 5 have changed since time $t_3$, and therefore the versions of those data portions will be retrieved from the actual dictionary 602. Note however, that in this example, the fourth proportional portion 612D includes the previous version of data portion 4 while the fourth incremental portion 614D includes the current version of data portion 4. This can be desirable for performing a rollback in a manner described below. However, it should be noted that not all examples of the present disclosure retain both versions in the fourth snapshot update 604D. At this point, the sliding window 606 includes the second, third, and fourth snapshot updates 604B-604D. A fourth partial manifest may be generated or the fourth full manifest may be updated in a similar manner as described above.

The techniques for the fifth snapshot update 604E can follow a similar pattern. At $t_5$ (snapshot count=5), the fifth proportional portion 612E includes data portions 2 and 5, and it can be seen that data portion 1 has changed since time $t_4$ and therefore will be included in the fifth incremental portion 614E. At this time the sliding window 606 will be at the location depicted in FIG. 6, and the active snapshot updates are the third, fourth, and fifth snapshot updates 604C-604E. A fifth partial manifest may be generated or the fifth full manifest may be updated in a similar manner as described above.

In the example depicted in FIG. 6, it may be possible to rollback to any previous point in the sliding window 606. For example, in a case where it is desirable to obtain the state of the dictionary at time $t_3$, a manifest may first be generated to determine the locations of the data portions in the state they would have been at time $t_3$. In some examples, this is performed by first examining the manifest that was generated at time $t_3$ for the locations of the data portions. For example, the manifest for the third snapshot update 604C would indicate that the second, third, fifth, and sixth data portions can be found at locations in the third snapshot update 604C, that first data portion may be found in the first snapshot update 604A, and that the fourth data portion may be found in the second snapshot update 604B. However, since the first and second snapshot updates 604A-604B are no longer in the sliding window 606, they may be unavailable.

Therefore, the system performing the rollback process may look at the manifests of succeeding snapshot updates 604D-604E to locate data portions 1 and 4. As can be seen, the data portion 1 and 4 are found in the fourth snapshot update 604D. However, data portion 4, as noted, changed between times $t_3$ and $t_4$. Because restoring data portion 4 from the fourth incremental portion 614D would result in a version of data portion 4 that was not present in the dictionary at time $t_3$, the data portion 4 from the fourth proportional portion 612D, which reflects the version of data portion 4 as it was at time $t_3$.

In this manner, a rollback of the dictionary 602 may be performed for any time within the sliding window 606. Note that in some examples, the proportional portion of data portion 4 would not be carried forward to the snapshot update 604D; in such examples, data portion 4 may be obtained from a previous snapshot update (e.g., snapshot update 604B) outside the sliding window 606. In such examples, historical snapshot updates 604A-604B might not be automatically deleted or may be retained at least temporarily in order to provide the ability to roll back to a previous state.

Figure 7:
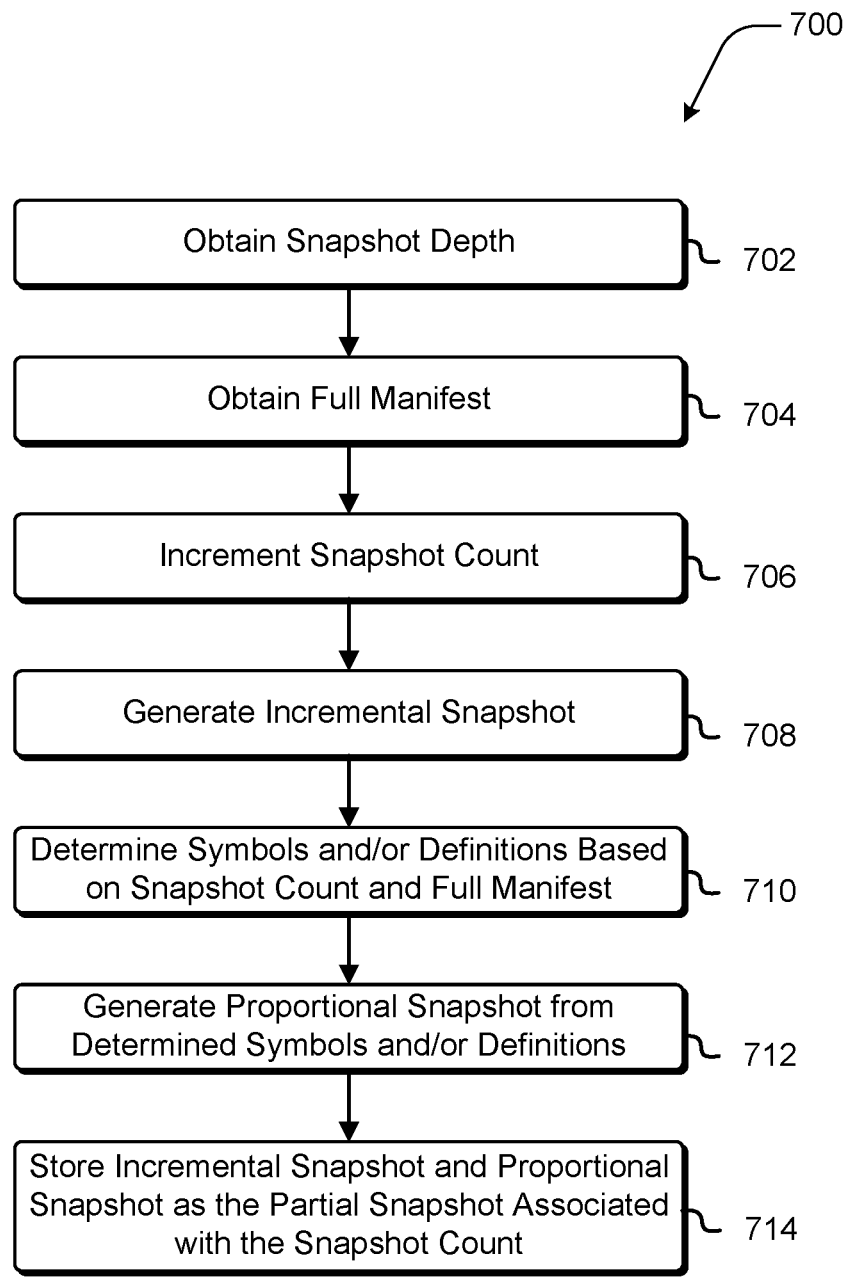
FIG. 7 is a block diagram that illustrates an example of performing a snapshot update in accordance with an example.

FIG. 7 is a block diagram illustrating an example of a process 700 for performing a snapshot update in accordance with various examples. The process 700 may be performed by any suitable system such as a server 102, 804, 904, 1004 of FIGS. 1, 8, 9, and 10, multiple computing devices in a distributed system of a computing resource service provider, or any electronic client device such as the user device 104, 802, 902, 1002 of FIGS. 1, 8, 9, and 10. The process 700 includes a series of operations wherein a snapshot is obtained, a dictionary manifest generated, a snapshot count is incremented, and snapshot updates of the dictionary are determined, obtained, and stored.

In 702, a maximum snapshot depth for a dictionary is obtained. For example, a service provider may determine that no more than 100 snapshot updates should be active (i.e., within the current snapshot window), and consequently set the maximum snapshot depth to 100. In some implementations, the determination of the maximum snapshot depth is made on a dictionary-by-dictionary basis. For example, small dictionaries may be configured to have a larger snapshot depth (e.g., 1,000 snapshot updates), whereas large dictionaries may have smaller snapshot depths (e.g., 100), because more storage resources may be required for storing the snapshot updates of the larger dictionaries than the smaller dictionaries.

Similarly, performance concerns may dictate the maximum snapshot depth. For example, for a given dictionary size, the shallower the snapshot depth, the longer it will take to generate the snapshot update. Taking a 1.6 gigabyte (GB) dictionary as an example, a snapshot depth of 16 means that each snapshot update will be at least 10 megabytes (MB) in size, whereas a snapshot depth of 6 means that each snapshot update will be at least 100 MB in size, and consequently consume more time and resources while being generated than the smaller snapshot.

In some implementations, the maximum snapshot depth can be specified by a customer of a computing resource service provider, where the computing resource service provider provides the dictionary to the customer. For example, the computing resource service provider may provide an application programming interface to the customer through which the customer can specify the customer desired maximum snapshot depth for the particular customer dictionary. Alternatively, a dictionary administrator can specify a maximum snapshot depth.

In 704, the system performing the process 700 may obtain a manifest that contains locations of data portions of a dictionary (also referred to as "chunks"). The locations of the data portions indicated in the manifest may be locations in one or more full or snapshot updates, or may be locations of the data portions in the actual dictionary (e.g., locations of identifiers and/or definitions). For example, in a scenario where a full snapshot exists for a dictionary as well as five snapshot updates of the present disclosure, the manifest might indicate that a most recent version of first chunk is located at a particular location in the full snapshot, a most recent version of second chunk is located in a particular location in a third snapshot update, a most recent version of the third chunk is located in a particular location in a first snapshot update, and so on. The manifest may also indicate the locations of the chunk in the actual dictionary so that it can be determined whether the chunk in the actual dictionary is more up-to-date than (i.e., has been updated since) the most recent version of the corresponding chunk in a partial or full snapshot.

In 706, a snapshot count is incremented. In examples, the system performing the process 700 keep track of the number of snapshot updates made of a particular dictionary by use of the snapshot count. The snapshot count is incremented in 706 to reflect the upcoming snapshot update generated in 708-14. In 708, an incremental snapshot is generated. The incremental snapshot includes data portions that have been modified since the preceding snapshot update was made.

For example, if one or more identifiers and/or corresponding definitions of a data portion was modified before time $t_1$ and the data portion was included in a snapshot update taken at time $t_1$, if, at time $t_2$, none of the identifiers and/or definitions of the data portion had been modified since time $t_1$, the data portion would not be included in the incremental snapshot taken at time $t_2$. On the other hand, if one or more identifiers and/or corresponding definitions of the data portion had been modified between time $t_1$ and time $t_2$, the data portion would be included in the incremental snapshot taken at time $t_2$. Similarly, any data portion whose identifiers and/or definitions remain unmodified from an initial snapshot or from the dictionary at an initial state would not be included in the incremental snapshot.

Note that in some implementations, the operations of 608, rather than generating an actual snapshot, generate a list of data portions that have been modified since the preceding snapshot and their locations in the dictionary to be included in the snapshot update. That is, in some examples the operations of 708-10 result in a set of identifiers and/or definitions to be included in a snapshot update, and the operations of 712 may generate the snapshot update based at least in part on that set of identifiers and/or definitions.

In 710, the system performing the process 700 may determine a set of identifiers and/or definitions to include in a proportional portion of the snapshot update. The set of identifiers and/or definitions may comprise at least 1/Nth of the identifiers and/or definitions of the dictionary, where N is the maximum snapshot depth. The selection of which 1/Nth of the identifiers and/or definitions to include in the set of identifiers and/or definitions may be made in a variety of ways. For example, where N is 10, the first proportional portion (i.e., the proportional portion determined by the system performing the process 700 at a time $t_1$) may be the first 10% of identifiers and/or definitions in the dictionary, the second proportional portion (i.e., the proportional portion determined by the system performing the process 700 at a time $t_2$) may be the second 10% of identifiers and/or definitions in the dictionary, and so on.

Alternatively, where N is 10, the dictionary may be divided into numbered chunks, and if the modulus 10 of the chunk number matches the modulus 10 of the incremented snapshot count, that corresponding chunk may be included in the set of identifiers and/or definitions for a proportional portion of the snapshot update. The latter method may result in the proportional portions being selected in an interlaced/interleaved fashion, while the former method may result in the proportional portions being selected in a progressive (i.e., non-interlaced) fashion. There may be advantages of one method over the other, depending on the particular implementation of the present disclosure, and other methods for selecting proportional portions are additionally contemplated.

In some examples, the maximum snapshot depth (i.e., the size of the sliding window) is dynamically adjusted. For example, the maximum snapshot depth may be increased during periods of scarce computing resources in order to accommodate smaller snapshot updates. Conversely, during periods of surplus computing resources (e.g., network demand falls below a minimum threshold/sentinel value, a number of idle storage devices exceed an upper threshold, processor idle time exceeds a threshold, etc.), the maximum snapshot depth may be decreased, allowing for larger snapshot updates. Note that, in some cases where the maximum snapshot depth is dynamically decreased, the deletion of some snapshot updates outside the sliding window may be delayed until all parts of the dictionary/rolling rebase have been carried forward into the sliding window.

Alternatively, if it is estimated/determined that the time required to perform the process 700 at a current maximum snapshot depth would exceed a maximum time threshold, the maximum snapshot depth may be increased to an amount sufficient to keep the time required to perform the process 700 below the threshold. Determinations of whether computing resources are scarce or in surplus may be made by a monitoring application or service that may be configured to adjust the maximum snapshot depth to a determined appropriate depth dynamically. For example, if computing resources are determined to be sufficient (e.g., little or no performance impact to customers of the computing resource service provider) to perform a full snapshot, the maximum snapshot depth may be changed to 1 for as long as available computing resources are determined to be sufficient, thereby causing full snapshots to be performed periodically or otherwise according to the snapshot update schedule.

As another example, if a snapshot update is being performed with a maximum snapshot depth of 10 and it is determined in 710-12 by the system performing the process 700 that computing resources currently allocated to performing the process 700 need to be released and made available to some other process, the maximum snapshot depth may be dynamically increased in order for the process 700 to complete more quickly. For example, if, in the previous example, the system performing the process had up to this point only determined and obtained 1% of the proportional portion of the snapshot update, the maximum snapshot depth may be increased to 100, and the process 700 may consequently be concluded. In this manner, in such examples, the number of data portions in the set of data portions and/or sizes of the proportional snapshots can vary from snapshot to snapshot.

In another example, the maximum snapshot depth is adjusted on demand by a customer owner of the dictionary or some other authorized entity such as a dictionary administrator. For example, a computing resource service provider may have a billing plan whereby customers are charged based at least in part on the number of dictionary snapshots performed. In such an example, a customer may choose to reduce the maximum snapshot depth in order to minimize his charges. As another example, a computing resource service provider may have a billing plan whereby customers are charged based at least in part on the size of snapshots that are performed. In such an example, a customer may choose to increase the maximum snapshot depth in order to reduce the size of the snapshot updates and thereby minimize his charges. The maximum snapshot depth may be adjusted in these examples using a web interface and/or an application programming interface provided by the computing resource service provider.

Also in 710, in some examples, data portions in the set of identifiers and/or definitions which are duplicative of identifiers and/or definitions already selected for the incremental portion of 708 are excluded from the set of identifiers and/or definitions. In this manner, the size of the snapshot update may be minimized by avoiding the inclusion of duplicate identifiers and/or definitions. Note that in examples where the order of determining the identifiers and/or definitions for the incremental portion and the identifiers and/or definitions for the proportional portion is reversed, the duplicate data portions may be excluded from the incremental portion instead.

Additionally, in some implementations where a most recent version of identifiers and/or definitions is selected for the set of identifiers and/or definitions for the proportional portion is found in a snapshot within N snapshots of the current snapshot (i.e., the snapshot window), that identifier and/or definition would also be excluded from the set of identifiers and/or definitions. That is, where a goal of an example of the present disclosure is to ensure that a full re-base or restore of the dictionary can be accomplished using only N snapshots, as long as that identifier and/or definition is within the snapshot window the goal can be accomplished and the size of the current snapshot update can be minimized by excluding the duplicate identifier and/or definition.

As noted, in some implementations, the snapshots of 708 and 712 can be combined into a single snapshot update, whereas in other implementations the snapshots of 708 and 712 can result in separate snapshots that may be both stored in association with the snapshot count number and may be cumulatively considered to be the snapshot update.

Note that the process 700 may be performed periodically (e.g., every hour, every day, every week, etc.) or according to some other schedule (e.g., next Wednesday at 3:00 PM, every third Tuesday, the last full weekend in July, etc.). Additionally or alternatively, the process 700 may be performed in response to the occurrence of an event. For example, the process 700 may be triggered by the system detecting that computing resource usage, such as network demand, has fallen below a threshold value, making it a good time to perform the process 700.

As another example, the system may detect that a number of changed identifiers and/or definitions have exceeded the threshold, and therefore the process 700 should be performed to capture those changes. Similarly, as another example, the system may detect that a identifier and/or definition or other data portion that has been flagged with high importance has changed, and consequently the process 700 should be performed to capture that change. Additionally or alternatively, the process 700 may be performed on demand in response to a request by a customer owner of the dictionary or some other authorized entity to perform a snapshot such as a dictionary administrator. Note too that one or more of the operations performed in 702-714 may be performed in various orders and combinations, including in parallel. For example, in some examples, the operations of 710-712 are performed prior to or in parallel with the operations of 708.

In various examples, snapshots as discussed in FIGS. 3-7 can be a set of dictionaries 101, 200 as discussed in FIGS. 1 and 2, or the like. For example, referring to FIG. 1, one or more snapshot can be generated by the server 102 to capture changes to a base dictionary 108 (and/or primary or secondary sub-dictionaries 110, 112) and such snapshots can be sent to the user device 104 so that a current state of the base dictionary 108 (and/or primary or secondary sub-dictionaries 110, 112) can be obtained at the user device 104 such that identifiers and definitions are shared between the server 102 and user device 104.

In one example, such snapshots can be used to generate at the user device 104 a set of one or more dictionaries that mirror a set of one or more dictionaries at the server 102. In another example, such snapshots can be used to obtain at the user device 104 a set of identifiers and corresponding definitions that mirrors a set of one or more identifiers and corresponding definitions at the server 102. In other words, a set of dictionaries on the server 102 and user device 104 may not be identical, but the set of identifiers and corresponding definitions defined by such sets can be identical.

Dictionaries can be used to encode and compress various types of communications, including the communication of content such as webpages, videos, images, text, audio, and the like. In various examples, webpage content having a conventional form (e.g., HTML, JavaScript, CSS, images, and the like) can be compressed and presented as an image that mimics the webpage content. In some examples, such an image can be lossy. In other words, the image of the content is not a one-to-one representation and may include less functionality, resolution, content, or the like, but may generally function and look the same way as the original content was intended to be presented.

Additionally, different dictionary sets can be used to encode different portions of content. For example, where the content is a webpage, a first set of dictionaries can be used for JavaScript, a second set of dictionaries can be used for CSS, and a third set of dictionaries can be used for HTML. Accordingly, different dictionaries can be configured for compressing a specific type of software code or a specific type of content.

Figure 8:
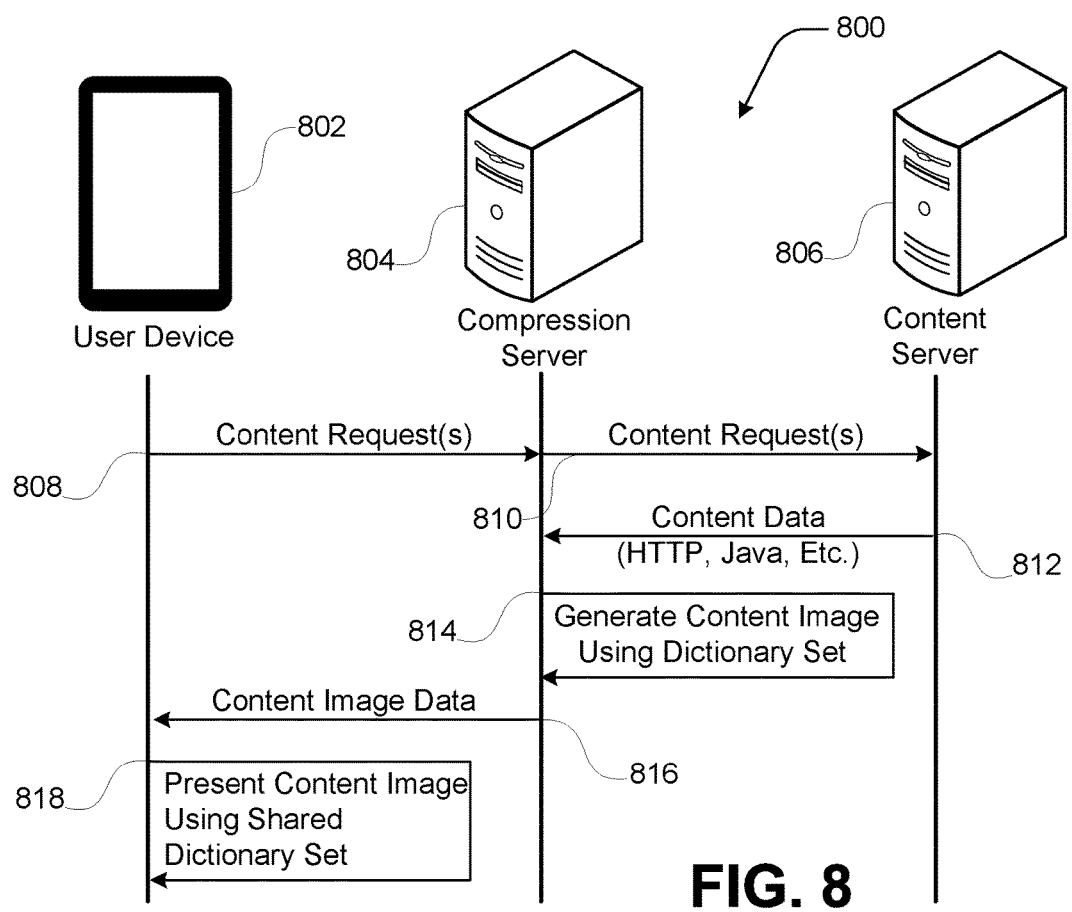
FIG. 8 is a data flow diagram illustrating communications between a user device, compression server and content server for compressing and presenting content as a content image.

FIG. 8 illustrates one example set of communications 800 between a user device 802, compression servicer 804 and content server 806. The user device 802 can be the user device 104, 902, 1002 of FIG. 1, 9, or 10. The compression server 804 and/or content server 806 can be the server 102, 904, 1004, of FIG. 1, 9, or 10. The communications 800 begin where one or more content request is sent 808 to the compression server 804 and one or more content request is sent 810 to the content server 806. For example, the user device 802 may request a webpage, which may also include images, video, audio, and the like, and this request may be routed through the compression server 804, which queries the content server 806, which stores the requested webpage content.

The content server 806 sends 812 content data to the compression server 804, where a content image is generated 814 using a dictionary set. For example, as discussed herein, a dictionary set can comprise a base dictionary, one or more sub-dictionary, and/or one or more snapshot dictionary. The content image data is sent 816 to the user device 802, where the content image is presented 818 using the shared dictionary set. For example, as discussed herein, the compression server 804 and user device 802 can share a set of dictionaries (or identifiers and associated definitions), and where the compression server 804 uses a shared dictionary set to generate 814 the content image, the user device 802 can decode the content image data because it has access to the set of dictionaries (or identifiers and associated definitions).

Figure 9:
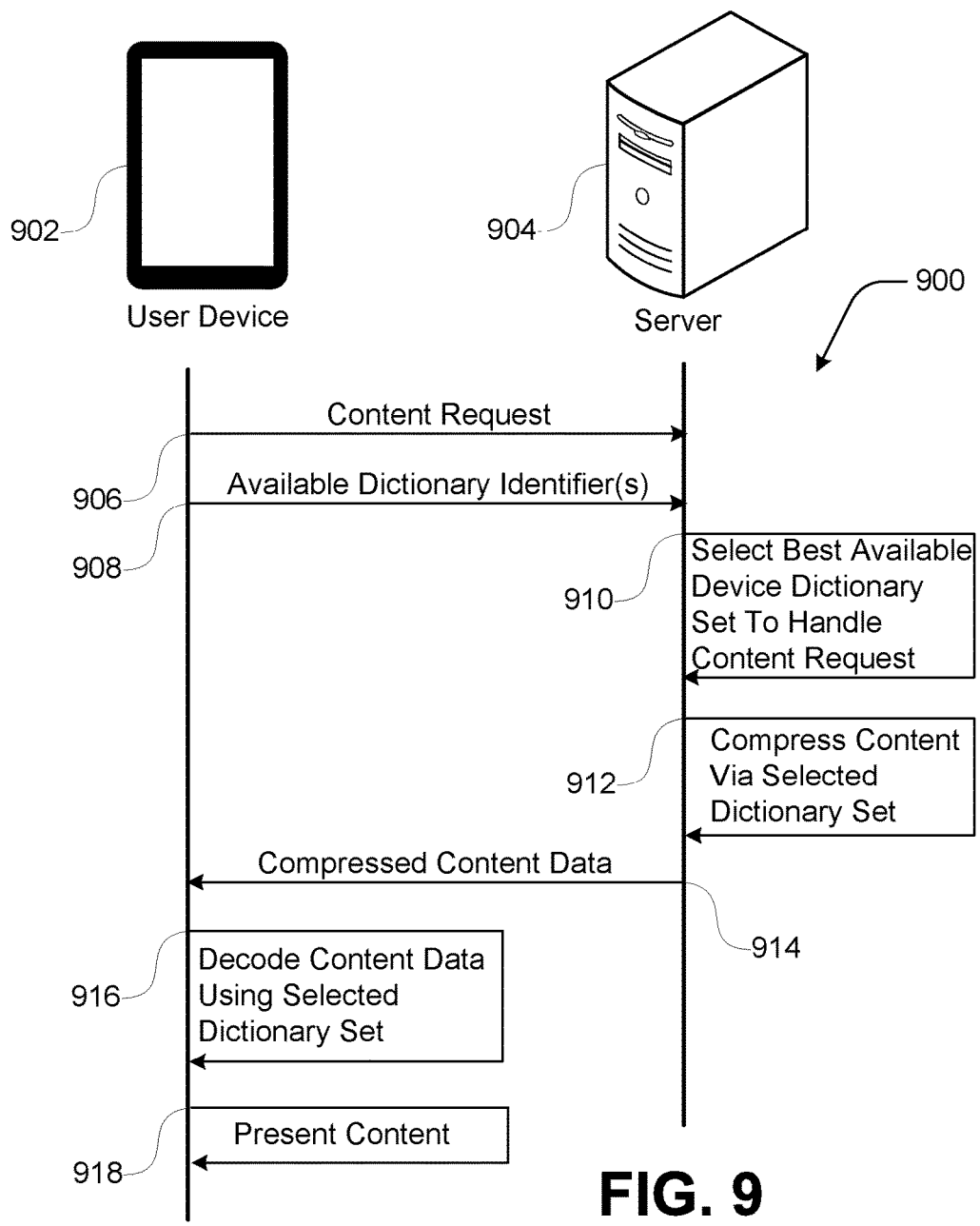
FIG. 9 is a data flow diagram illustrating communications between a user device and server for selecting and using a dictionary set to compress content and providing the compressed content to the user device.

Negotiating a set of one or more dictionaries to use to encode and compress communications can be done in various suitable ways. For example, FIG. 9 illustrates a set of communications 900 between a user device 902 and server 904 for requesting content and presenting the content at the user device 902 using a selected dictionary set. The user device 902 can be the user device 104, 802, 1002 of FIG. 1, 8, or 10. The server 904 can be the server 102, 804, 806, 1004 of FIG. 1, 8, or 10.

The communications 900 begin where a content request is sent 906 to the server 904 and one or more identifiers of available dictionaries is sent 908 to the server 904. In various examples, the content request can include a request for content such as a webpage, text, audio data, an image, a video, or the like. Dictionary identifiers or metadata can include an identifier of one or more dictionaries, including one or more base dictionary, one or more sub-dictionary, and/or one or more snapshot dictionary, and the like). Dictionary identifiers can include unique or non-unique identifiers of dictionaries, and can also include reference to dependence among dictionaries, where applicable. In some examples, dictionary identifiers can include an identifier of identifiers present in the dictionaries. In further examples, dictionary identifiers can include a version number, a date, a timestamp, or the like.

Returning to the communications 900, the server 904 selects 910 the best available device dictionary set to handle the content request and compresses 912 the content via the selected dictionary set. Accordingly, the selected 910 device dictionary set to handle the content request can be a set of dictionaries that are shared by the user device 902 and server 904 or a set of identifiers and definitions that are shared by the user device 902 and server 904, even if the dictionaries that define the shared identifiers and definitions are not identical.

Selecting 910 the best available device dictionary set to handle the content request can be based at least in part on various factors including, dictionaries available to the server, 904 amount of compression gained, type of content being compressed, memory available at the user device 902, geographic location of the user device 902, central processing unit (CPU) speed or capacity of the user device 902, type of user device 902, network conditions, internet service provider (IPS) handling the request, security associated with the request, throughput of the network, type of network, and the like.

Compressing 912 the content via the selected dictionary set can including encoding the content by identifying portions of the content, or code that defines the content, that matches definitions of the selected dictionary set and replacing these matching portions with appropriate identifiers associated with the identified portions of the content. Accordingly, the size of the content can be reduced, which can be desirable when communicating such content over a network.

Returning to the communications 900, compressed content data is sent 914 to the user device 902 where the content data is decoded using the selected dictionary set and the content is presented 918 at the user device. Decoding the content data can include identifying the selected dictionary set and identifying identifiers in the content data corresponding to identifiers in the dictionary set and replacing the identified identifiers with definitions corresponding to the identifiers as defined by the dictionary set. Identifying the dictionary set can be based at least in part on a communication from the server 904, which may be a portion of the compressed content data. For example, the content data can include a header (e.g., IP header, HTTP header, or the like) that defines the dictionary set being used in the payload of the message or the server and user device can negotiate use of a dictionary set during a communication session such that packet headers need not include an indication of the dictionary set being used to compress the payload of the packets during the session.

Figure 10:
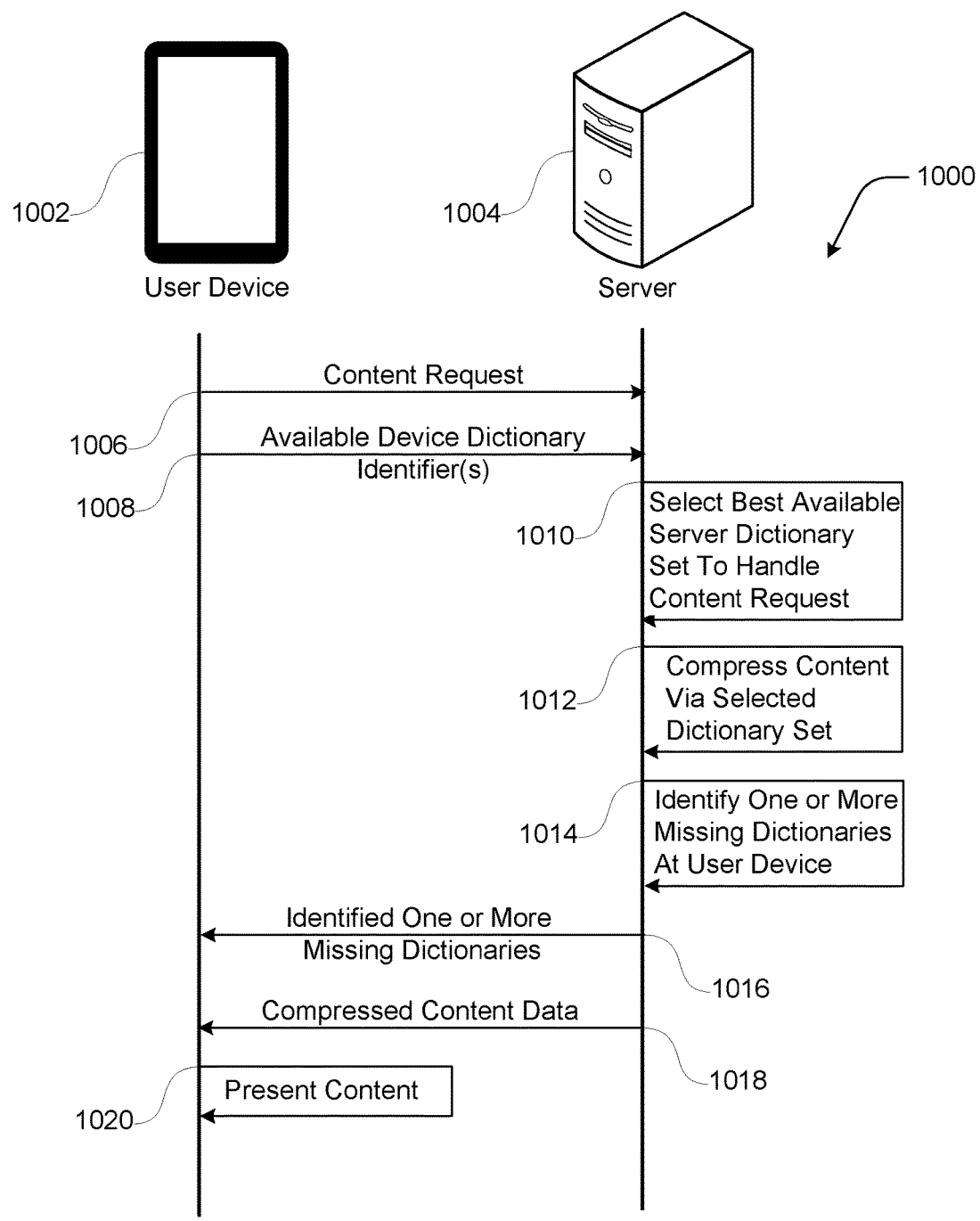
FIG. 10 is a data flow diagram illustrating communications between a user device and server for selecting and using a dictionary set to compress content and provide the compressed content to the user device along with one or more supplementary dictionary.

In the example of FIG. 9, the server 904 identifies and uses a set of dictionaries (or a set of identifiers and definitions) that the user device 902 already has. However, in some examples, and as illustrated in FIG. 10, a server 1004 can identify one or more dictionaries that can be sent to a user device 1002, which can be used to replace or augment dictionaries present on the user device 1002. For example, FIG. 10 illustrates a set of communications 1000 between a user device 1002 and server 1004 for requesting content and presenting the content at the user device 1002 using a selected dictionary set that includes dictionary portions that are sent to the user device 1002. The user device 1002 can be the user device 104, 802, 902 of FIG. 1, 8, or 9. The server 904 can be the server 102, 804, 806, 904 of FIG. 1, 8, or 9.

The communications 1000 begin where a content request is sent 1006 to the server 1004 and one or more identifiers of available dictionaries are sent 1008 to the server 1004. As discussed above, the content request can include a request for content such as a webpage, text, audio data, an image, a video, or the like. Dictionary identifiers or metadata can include an identifier of one or more dictionaries, including one or more base dictionary, one or more sub-dictionary, and/or one or more snapshot dictionary, and the like. Dictionary identifiers can include unique or non-unique identifiers of dictionaries, and can also include reference to dependence among dictionaries, where applicable. In some examples, dictionary identifiers can include an identifier of identifiers present in the dictionaries. In further examples, dictionary identifiers can include a version number, a date, a timestamp, or the like.

Returning to the communications 1000, the server 1004 selects 1010 the best available dictionary set to handle the content request and compresses 1012 the content via the selected dictionary set. Accordingly, the selected 1010 dictionary set to handle the content request can be a set of dictionaries (or a set of identifiers and definitions) that are present at the server 1004 and which may or may not be present at the user device 1002.

Selecting 1010 the best available device dictionary set to handle the content request can be based at least in part on various factors including dictionaries available to the server 1004 and/or user device 1002, amount of compression gained, type of content being compressed, memory available at the user device 1002, geographic location of the user device 1002, central processing unit (CPU) speed or capacity of the user device, type of user device 1002, network conditions, internet service provider (IPS) handling the request, security associated with the request, throughput of the network, type of network, and the like.

Additionally, where one or more dictionaries are identified as being desirable for use in handling the content request, but such dictionaries are not currently available to the user device 1002, further factors can be used to determine whether such candidate dictionaries should be used to handle the request. For example, such further factors can include, the size(s) of the one or more dictionaries, time required to provide the one or more dictionaries to the user device 1002, time required to implement the one or more dictionaries at the user device 1002, and the like.

Accordingly, a determination can be made whether benefits in speed and compression gained by such dictionaries would be outweighed by the time it would take to send such one or more new dictionaries to the user device 1002 and implement the one or more dictionaries at the user device 1002. In other words, even if providing one or more new dictionaries to the user device 1002 would result in desirable speed and compression for communications between the user device 1004 and server 1002, the time it would take to send such one or more new dictionaries may cause an undesirable delay which would outweigh implementation of such new one or more new dictionaries.

Returning to the communications 1000 of FIG. 10, with a dictionary set selected 1010, the content is compressed 1012 via the selected dictionary set and one or more dictionaries that are part of the selected dictionary set, but missing at the user device 1002 are identified and sent 1016 to the user device 1002. The content data that was compressed via the selected dictionary set is sent 1018 to the user device 1002 and presented 1020.

As illustrated in the example of FIG. 10, the server 1004 can select a set of dictionaries to compress communications and provide one or more of the dictionaries of the set to a user device 1002 so that the dictionaries become shared. For example, such dictionaries can include one or more base dictionary, one or more sub-dictionary and/or one or more snapshot dictionary. In contrast, FIG. 9 illustrates an example, where the server 904 selects dictionaries that are already shared between the server 904 and user device 902. In further examples, a hybrid of these two examples can be used to communicate between a server and user device.

For example, a server can identify a set of dictionaries (or identifiers and definitions) that are already shared by the server and a user device and also identify a set of dictionaries (or identifiers and definitions) that include at least a portion that is not currently shared by the server and a user device. Instead of immediately encoding correspondence with the unshared dictionaries and sending those unshared dictionaries to the user device, the server can instead first send communications encoded with the shared set of dictionaries while sending the unshared dictionaries, and then begin to send communications using the previously unshared dictionaries once the new dictionaries are received and implemented at the user device. Accordingly, in some examples, the server can send communications with currently shared dictionaries until more desirable dictionaries are sent to the user device during the session. This can be desirable because it can allow initial content to be obtained and presented by the user device without having to wait until new dictionaries are received and implemented.

Figure 11:
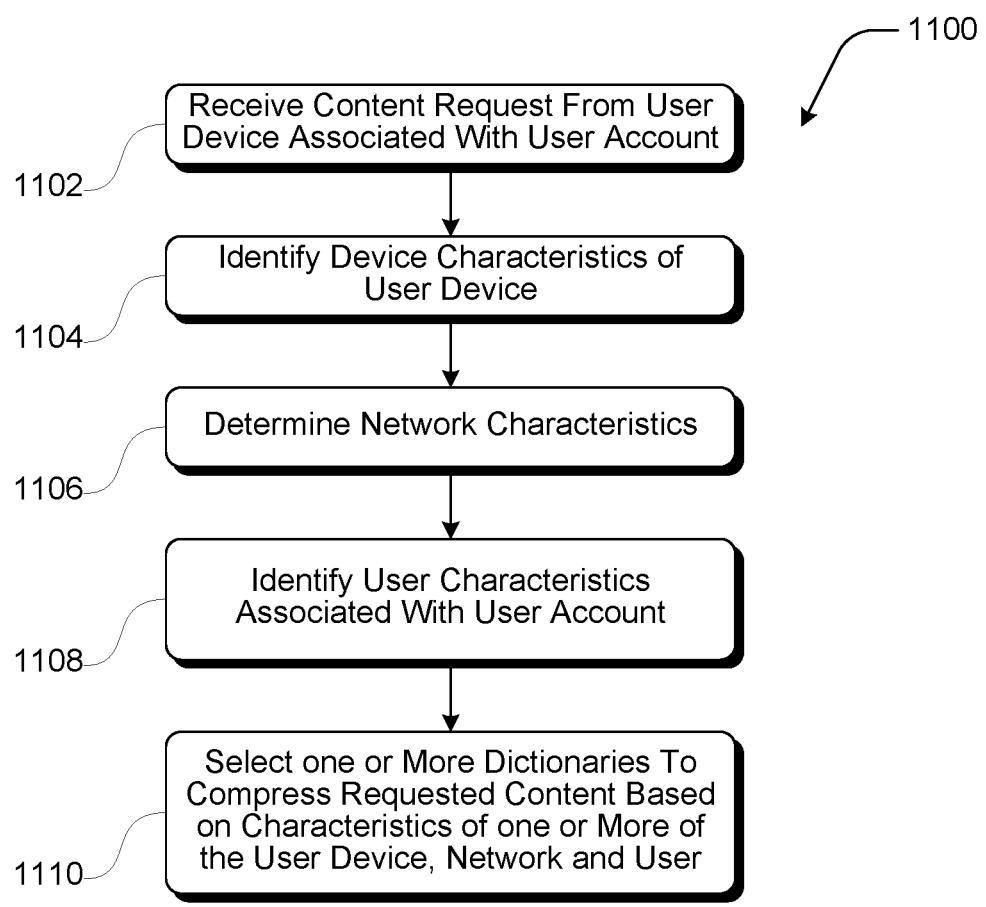
FIG. 11 is a block diagram illustrating an example method for selecting one or more dictionaries based at least in part on characteristics of one or more of user device, network or user characteristics.

FIG. 11 illustrates a block diagram of a method 1100 for selecting one or more dictionaries to compress content. In various examples, this method can be performed by the server 102, 804, 806, 904, 1004 of FIG. 1, 8, 9, or 10. The method 1100 begins where a content request is received 1102 from a user device associated with a user account. In various examples, the user device can be the user device 104, 802, 902, 1002 of FIG. 1, 8, 9, or 10.

The method 1100 continues where characteristics of the user device are identified 1104. For example, characteristics of the user device can include, the type of device (e.g., smartphone, tablet computer, e-reader, wearable computer, desktop computer, or the like), chipset of the user device, CPU capabilities of the user device, memory capacity of the user device, display of the user device, audio capabilities of the user device, operating system of the user device, geographic location of the user device, and the like.

Network characteristics can also be determined 1106, which can include bitrate, packet loss rate, bandwidth, type of network, communication path, location(s) of network, protocol(s) used by network, ISPs associated with network, cost of network use, and the like. Network characteristics can be determined in various suitable ways, which can be based on current information about the network or can be implied or assumed based on various criteria. For example, a network condition can be implied or assumed based on day and/or time (e.g., a given network is considered to be strained from 4:00 PM-7:30 PM on weekdays). Additionally user characteristics associated with the user account associated with the content request can be identified 1108, which can include user location, user browsing history, user search history, user purchase history, gender, age, income, user account type, and the like.

One or more dictionaries can be selected 1110 to compress the requested content based at least in part on characteristics of one or more of the user device, network and user. In other words, in some examples, a set of one or more dictionaries can be selected to fulfill a request based at least in part on various conditions, characteristics, capabilities, browsing history, previous dictionary use, previous dictionary efficiency, or the like, associated with the content request. For example, network characteristics can affect the rate at which supplementary or additional dictionaries can be shared with a user device, and if a determination is made that the network is too slow to transmit large dictionaries, selection of dictionaries that are already shared by the server and user device can be more desirable.

In another example, certain dictionaries may provide for faster or slower decoding at the user device based at least in part on the configuration, capabilities or status of the user device, and therefore a certain set of dictionaries can be selected for a given user device based at least in part on the speed at which the user device could decode or otherwise implement a certain set of dictionaries. Similarly, where a given user device has certain limitations, certain dictionaries can be used to provide greater compression without substantial loss of perceived quality. For example, where a user device has a small or low resolution display, images can be compressed to a lower resolution by certain dictionaries, and the compression and lower resolutions may be unperceivable on the lower resolution screen.

In a further example, where a user has a history of browsing webpages having a certain class of content (e.g., the user likes to shop for shoes), a set of dictionaries can be selected which would perform better based at least in part on what sort of browsing the user is predicted to engage in during a given session. In yet another example, where webpages are rendered differently based at least in part on a user account status (e.g., registered user, unregistered user, premium user) and therefore some sets of dictionaries may provide more compression for different user account statuses. In yet another example, a webpage may be rendered differently based at least in part on location of the user and/or user device (e.g., due to language or content display limitations) and certain sets of dictionaries may be selected based at least in part on how webpages will be rendered based at least in part on user and/or user device location or detected user language settings.

Figure 12:
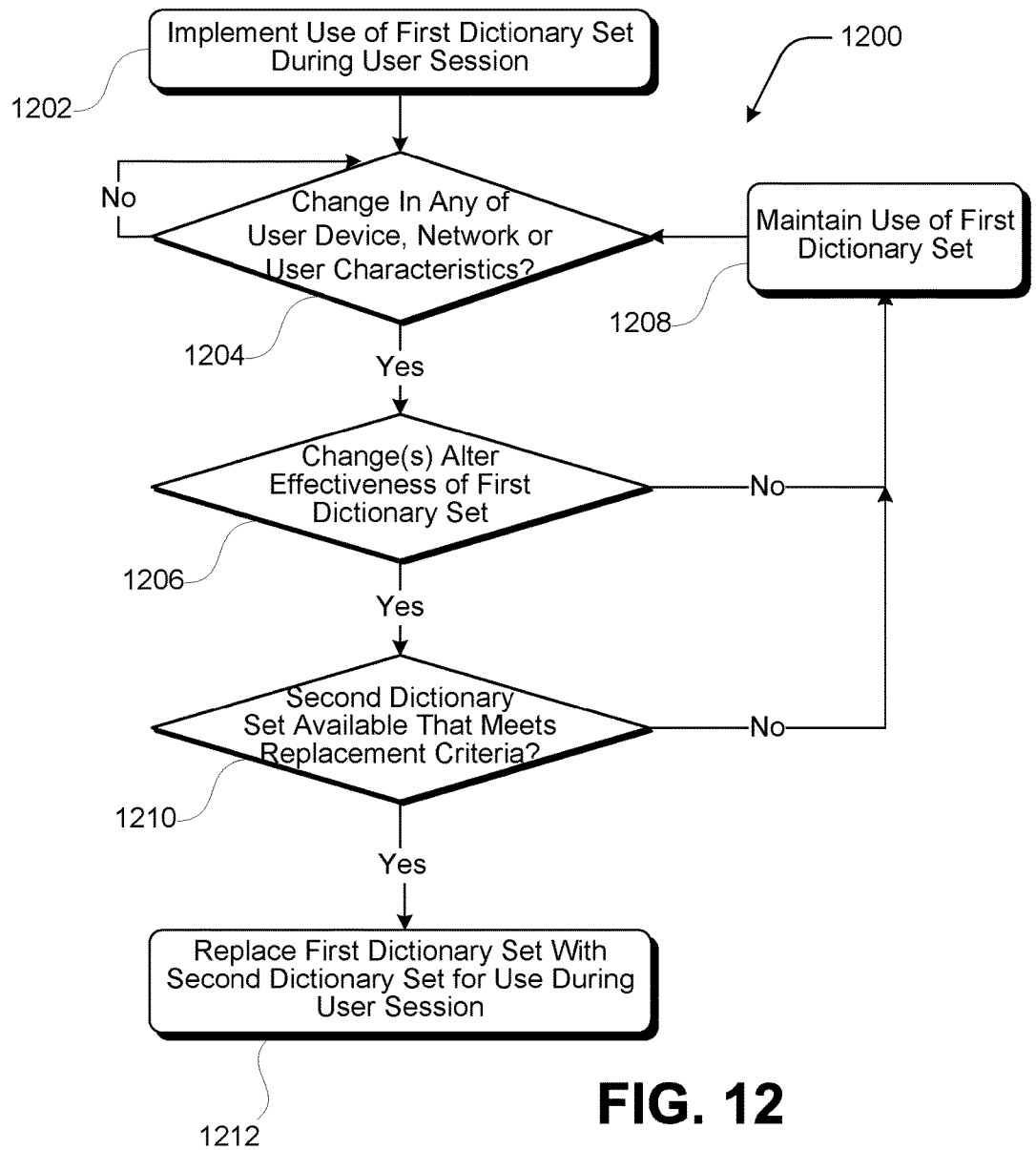
FIG. 12 is a block diagram illustrating an example method for replacing a used dictionary set during a user session based at least in part on changes in at least one of user device, network and user characteristics.

FIG. 12 illustrates a block diagram of a method 1200 for modifying a set of dictionaries used during a communication session. In various examples, this method can be performed by the server 102, 804, 806, 904, 1004 of FIG. 1, 8, 9, or 10. The method 1200 begins where use of a first dictionary set is implemented 1202 during a user session. For example, the user session can be with a user device 104, 802, 902, 1002 of FIG. 1, 8, 9, or 10. Additionally, the implementation 1202 can be via the method 1100 of FIG. 11 or the like.

At 1204, a determination is made whether there has been any change in the characteristics of any of a user device, network, or user associated with the user session. If not, the method 1200 continues to monitor for any such change and the method 1200 cycles at 1204. However, if such a change is detected, a determination is made, at 1206, whether such one or more change alters the effectiveness of the first dictionary set 1206. For example, if the user was browsing a first website where the first dictionary set provided optimal compression, and then the user begins browsing a second website, the effectiveness (e.g., compression or decoding rate) may be impacted in a negative way. If no change in effectiveness is detected, at 1206, the method 1200 continues, to 1208, where use of the first dictionary set is maintained, and the method 1200 then continues to monitor for changes in user device, network or user characteristics at 1204.

However, if a change in effectiveness is detected, at 1206, the method 1200 continues to 1210 where a determination is made whether a second dictionary set is available that meets replacement criteria. For example, where effectiveness of an implemented dictionary set is negatively impacted, the server (or other device performing the method) can analyze other candidate sets of dictionaries that it has available and also identify candidate sets of dictionaries that a user device associated with the user session has access to or could have access to if the server (or other device) sent one or more new or supplementary dictionaries to the user device.

Replacement criteria can include a determination of whether replacement of the first set would result in substantially increased compression of communications. For example, where compression is decreased or stays the same, replacement may not be desirable. Similarly, where compression is only slightly or insubstantially increased, overhead associated with replacing the first dictionary with another dictionary may cause a given candidate dictionary set to not meet replacement criteria. Additionally, where one or more dictionaries needs to be sent to the user device to achieve improved compression, if such sending would be time and/or resource consuming such that presenting content was negatively impacted in terms of quality or time, then such a candidate dictionary set may not meet replacement criteria.

Where a second dictionary set is not available that meets replacement criteria, then the method 1200 continues, to 1208, where use of the first dictionary set is maintained, and the method 1200 then continues to monitor for changes in user device, network or user characteristics at 1204. However, if a second dictionary set is available that meets replacement criteria, then the method 1200 continues, to 1212, where the first dictionary is replaced with the second dictionary set for use during the user session.

In various examples, a plurality of sets of dictionaries can be used simultaneously during a communication session. For example, a first set of dictionaries can be used to compress HTML code, a second set of dictionaries can be used to compress Java script, and a third set of dictionaries can be used to compress CSS. Alternatively, different sets of dictionaries can be used for different types of content or communications. For example, when a user is viewing a shopping cart of a website, a first set of dictionaries can be used, whereas where a user is viewing a "wish list" of items of a website, a second set of dictionaries can be used. In such examples, replacing a dictionary can refer to replacing one of the plurality of sets being used for a specific purpose with a dictionary that better fits that specific purpose.

Figure 13:
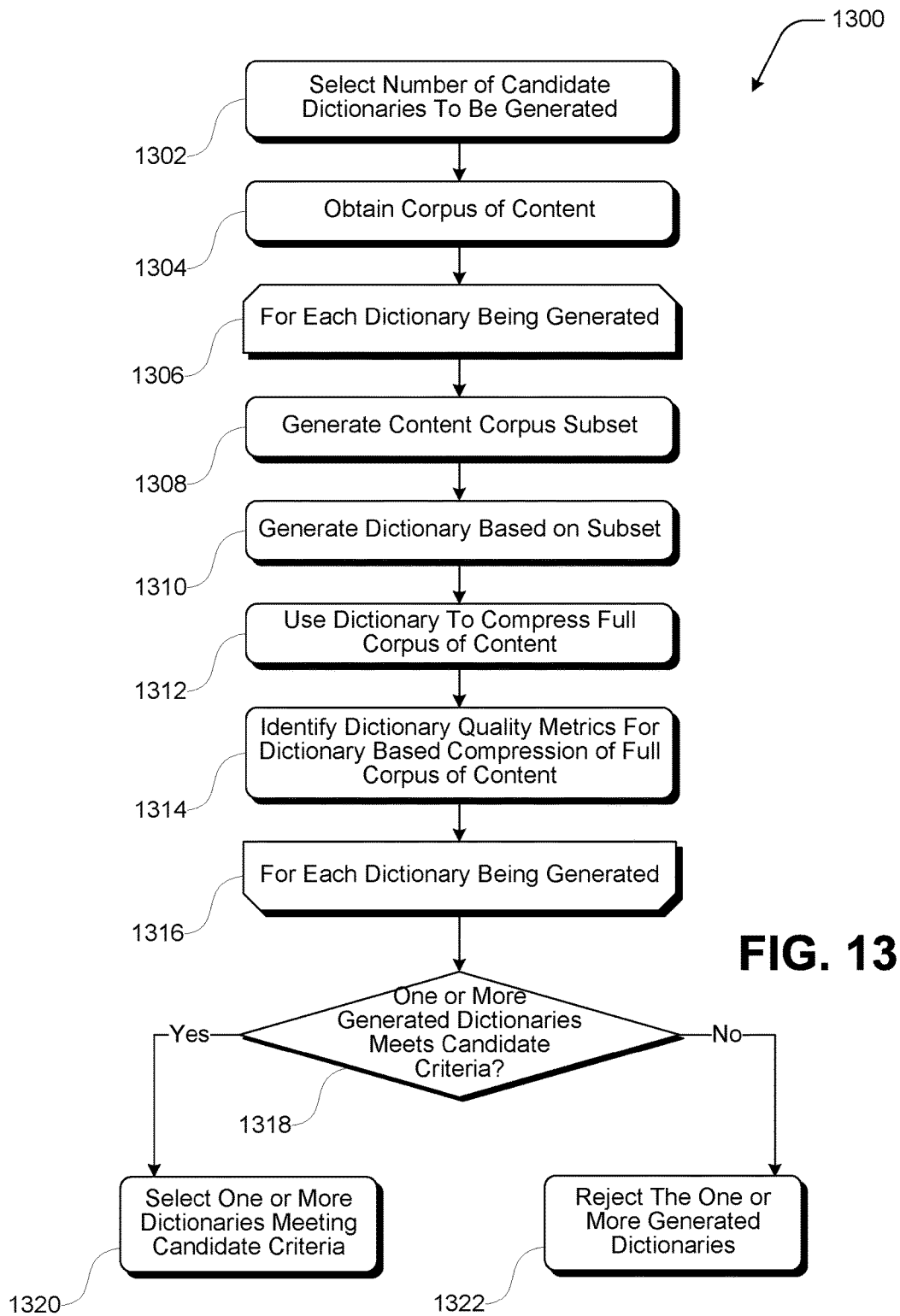
FIG. 13 is a block diagram illustrating an example method for generating and selecting candidate dictionaries.

FIG. 13 illustrates a method 300 for generating and selecting a dictionary. In various examples, this method 1300 can be performed by the server 102, 804, 806, 904, 1004 of FIG. 1, 8, 9, or 10. The method 300 begins where a number of candidate dictionaries for generation is selected 1302 and a corpus of content is obtained 1304. For example, a corpus of content can include various types of suitable content including a plurality of webpages, documents, images, videos, text, audio, software code, and the like. In some examples, the corpus of content can include a plurality of content types, and in other examples, the corpus of content can be limited to a single type of content. In one example, a set of website traffic can be used as a corpus of content and such traffic can be filtered based at least in part on various criteria including user type, user location, user device type, user operating system type, user browser type, user browsing history, and the like.

At looping block 1306, a loop begins for each dictionary being created. In other words, the steps of the loop can occur for each of the dictionaries selected 1302 for generation. The loop begins where a content corpus subset is generated 1308. For example, where a set of website traffic comprises the obtained corpus of content, a random subset of this website traffic can be selected for generating 138 the corpus subset with such a subset being any suitable portion of the corpus, including 1%, 5%, 10%, 20%, 30%, 40%, 50%, 60%, and the like.

Returning to the loop, a dictionary is generated 1310 based at least in part on the subset of the corpus. Generating 1310 a dictionary can be done in various suitable ways. For example, the corpus subset can be analyzed for common strings of various sizes and a set of identifiers and definitions based at least in part on identified common strings can be generated. Selection of which common or repeated strings should be included in a dictionary can be based at least in part on the length of the string, number of times the string appears in the corpus, and the like.

Returning to the method 1300, the generated dictionary is used 1312 to compress the full corpus of content and quality metrics for the generated dictionary based at least in part on compression of the full corpus of content are identified 1314. For example, quality metrics can include compression speed, size of full corpus before and after compression with the dictionary, size of the dictionary, and the like.

The loop for each dictionary being generated ends at looping block 1316 and a determination is made whether one or more of the generated dictionaries meet candidate criteria. Where one or more dictionaries meet selection criteria, these dictionaries are selected 1320. However, if no generated dictionaries meet selection criteria, then the one or more generated dictionaries are rejected 1322.

The identified 1314 dictionary quality metrics can be used to compare the candidate dictionaries to rank the generated dictionaries. Additionally, such dictionaries can be compared other dictionaries that are currently being used or that were previously generated. For example, candidate criteria can include selecting a dictionary that has quality metrics that are better than any dictionary currently being used. In other words, generated dictionaries may only be useful if such dictionaries perform better than existing dictionaries.

As discussed above, quality metrics can include compression speed, size of full corpus before and after compression with the dictionary, size of the dictionary, and the like, and therefore candidate criteria can be based at least in part on one or more of such quality metrics. For example, where a candidate dictionary provides less compression than a currently implemented dictionary, but is one tenth the size of the currently implemented dictionary, then the candidate dictionary may still be desirable. Similarly, where a candidate dictionary provides less compression than a currently implemented dictionary, but compression and/or decompression using the dictionary takes one tenth of the time of the currently implemented dictionary, then the candidate dictionary may still be desirable. Accordingly, in various examples, although compression ratio of a dictionary can be one desirable characteristic for selection criteria, various other criteria can be used to select desirable dictionary candidates.

Additionally, candidate dictionaries can be generated that are base dictionaries or sub-dictionaries. In other words, in some examples, candidate dictionaries can be generated which are based at least in part on or dependent upon a base dictionary or can be generated without any dependencies or associations with other dictionaries.

Dictionaries can be generated and used in various suitable ways. In one example, a website administrator can generate dictionaries to compress website content and new dictionaries can be generated over time as the website content changes, as user interaction with the website changes, as network specification change, and as methods for generating dictionaries change. Accordingly, in some examples, a company can use its own current content as a corpus of content that can be used to generate and test dictionaries that may be used to replace one or more dictionaries currently being used.

Figure 14:
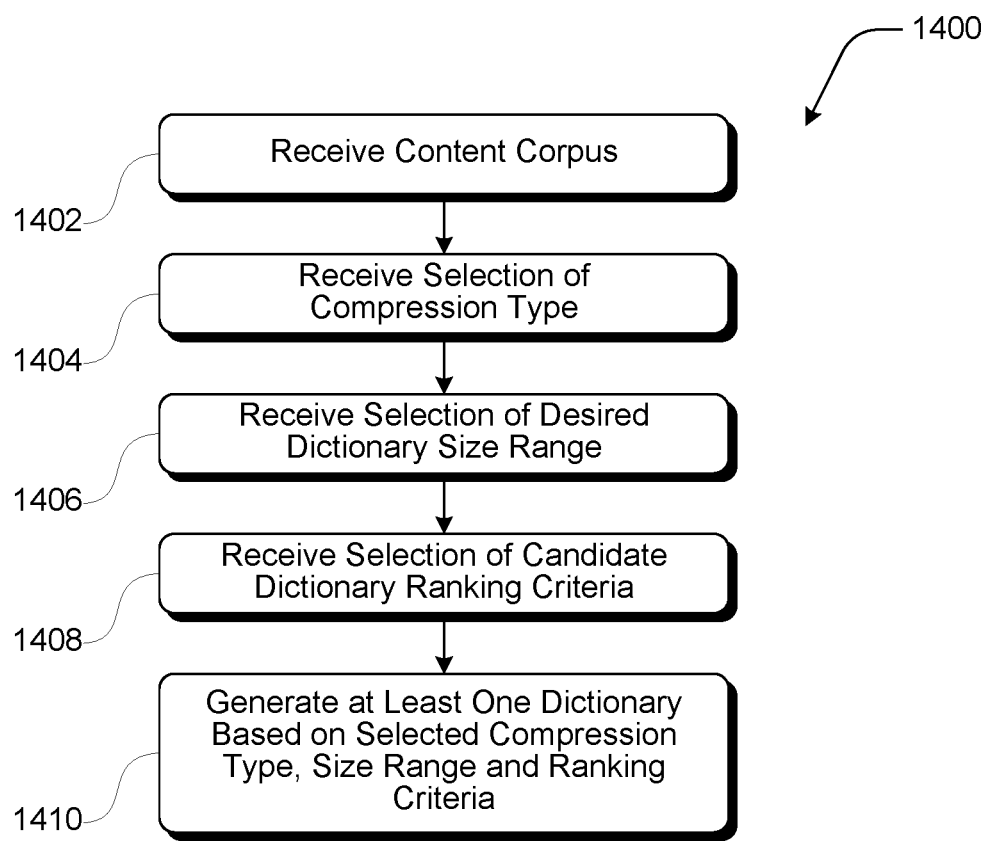
FIG. 14 is a block diagram illustrating an example method for generating candidate dictionaries as a service.

In further examples, a service provider can generate one or more dictionaries for a customer. In other words, a service provide can provide dictionary generation as a service to customers. For example, FIG. 14 illustrates a method 1400 of generating a dictionary, which can be used by a service provider to generate one or more dictionaries as a service. In various examples, this method 1400 can be performed by the server 102, 804, 806, 904, 1004 of FIG. 1, 8, 9, or 10.

The method 1400 begins where a content corpus is received 1402. As discussed in various examples of this disclosure, a content corpus can include various types of content including a plurality of webpages, documents, images, videos, text, audio, software code, and the like. Such a content corpus can be selected and provided by a customer to a dictionary generation service provider in various suitable ways, including granting the service provider access to content streams, providing one or more indicator of selected content, sending content, or the like.

The method 1400 continues where a compression type selection is received 1404 and where a dictionary size range selection is received 1406. In various examples a compression type can include a compression protocol, compression format, or the like. A dictionary size range selection can include a selection of the total size of the dictionary, a selection of the number of identifiers and definitions of a dictionary, the size or length of definitions and/or identifiers of a dictionary, or the like. Additionally, in some examples a size range can include a number and/or size of sub-dictionaries and/or based dictionaries and a size of all such sub-dictionaries and based dictionaries combined.

The method 1400 continues where a selection of candidate dictionary ranking criteria is received 1408. In some examples, such candidate dictionary ranking criteria can include compression speed, size of full corpus before and after compression with the dictionary, size of the dictionary, and the like. For example, a given customer may have different priorities based at least in part on the use of the dictionary, network in which a dictionary is used, users that user the dictionary, device(s) using the dictionary, and the like. For example, where a customer intends to use a dictionary (or set of dictionaries) with user devices having weak CPUs, the customer can prioritize generation of dictionaries that will be provide for fast decoding of content, even user devices having limited capabilities.

Alternatively, where a user intents to use a set of dictionaries with user devices where a base dictionary is shipped with the user device. The customer can select generation of a large base dictionary, which may or may not be updatable with sub-dictionaries. In this same example, where such user devices will likely be used on a network having limited bandwidth, the customer can select generation of sub-dictionaries that are small so that such sub-dictionaries can be communicated to the user devices even via the limited network.

Returning to the method 1400, at least one dictionary is generated 1410 based at least in part on the selected compression type, size range and ranking criteria. In some examples, the generated dictionaries can be a set of candidate dictionaries. In other words, alternative versions of one or more dictionaries can be generated for a customer. Additionally, as discussed in various examples of this disclosure a generated dictionary set can include one or more base dictionary, sub-dictionary, snapshot dictionary, and the like. In one example the dictionary is generated 1410 via a method comprising steps illustrated in FIG. 13.

Figure 15:
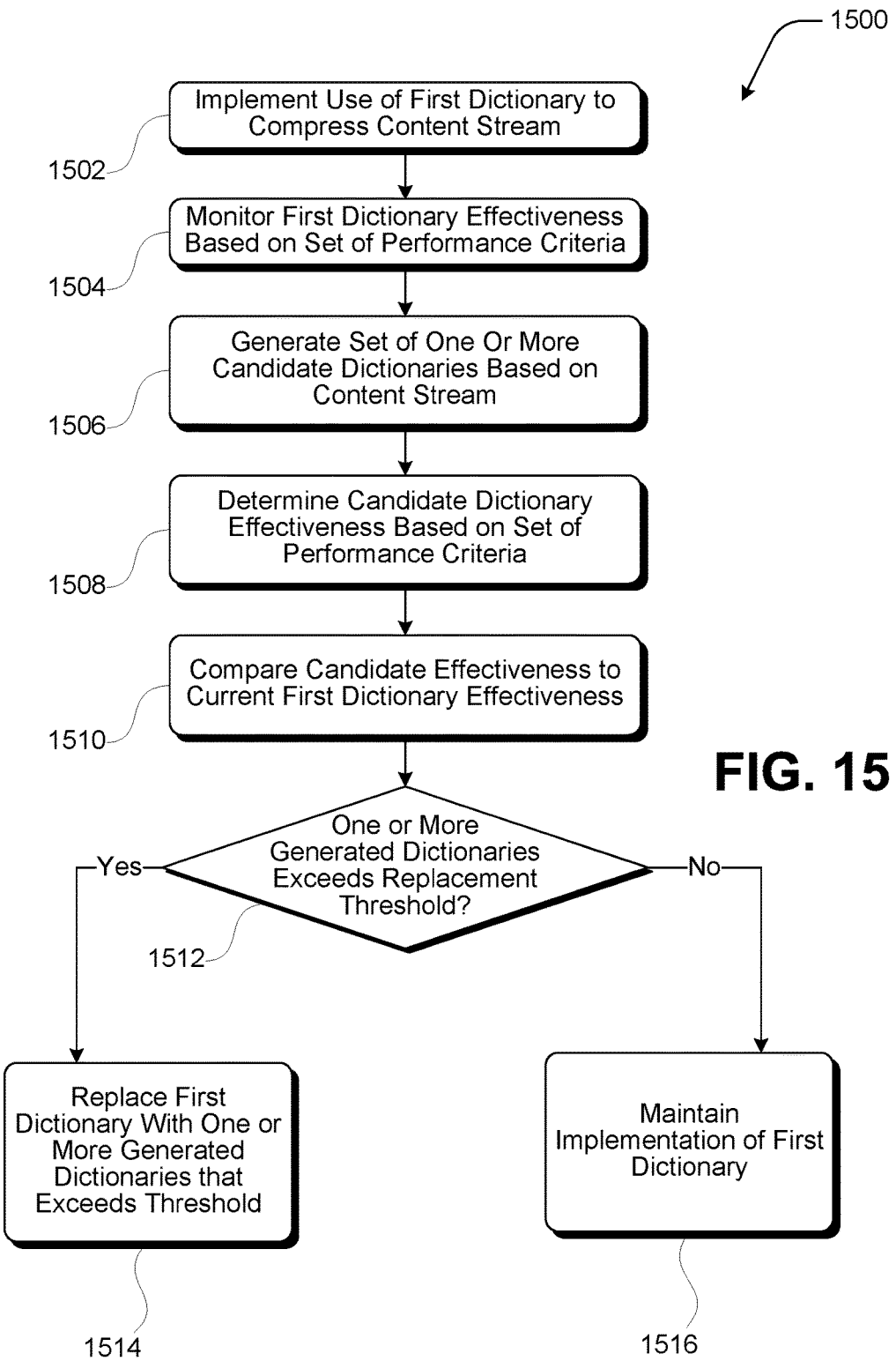
FIG. 15 is a block diagram illustrating an example method for monitoring effectiveness of a dictionary set and replacing the dictionary set with a newly generated dictionary set where a replacement threshold is exceeded.

FIG. 15 illustrates a method 1500 of monitoring the effectiveness of an implemented first dictionary and replacing it with a generated second dictionary when a replacement threshold is exceeded. In various examples, this method 1400 can be performed by the server 102, 804, 806, 904, 1004 of FIG. 1, 8, 9, or 10. The method 1500 begins where use of a first dictionary is implemented 1502 and the effectiveness of the first dictionary is monitored 1504 based at least in part on a set of performance criteria. Such monitoring can occur at regular intervals, in real time, or in near real time. For example, a "daily best" dictionary or dictionary set can be generated. Additionally, in some examples, certain events can trigger monitoring or review of a current dictionary set. For example, when a new website build occurs, the currently implemented dictionary can be evaluated for effectiveness.

Performance criteria can be associated with various metrics related to performance of a dictionary, including compression speed, size of full corpus before and after compression with the dictionary, size of the dictionary, and the like. For example, as network conditions change, user interaction with content changes, or as the content being compressed by the dictionary changes, the performance of the dictionary can change over time. In various examples, the first dictionary may have been tailored to content of a certain type, network condition of a certain type, or the like and this dictionary may become less effective over time.

Returning to the method 1500, a set of one or more candidate dictionaries is generated 1500 based at least in part on a content stream and the effectiveness of the one or more dictionaries can be determined 1508 based at least in part on a set of performance criteria, which can include the performance criteria discussed above. In some examples, the same performance criteria used to monitor the effectiveness of the first dictionary are used to determine the effectiveness of the one or more candidate dictionary.

The candidate effectiveness is compared 1510 to the effectiveness of the first dictionary, and at 1512 a determination is made whether one or more of the generated candidate dictionaries exceed a replacement threshold. A replacement threshold can include various factors, including a determination of whether replacement of the first dictionary would result in substantially increased compression of communications. For example, where compression is decreased or stays the same, replacement may not be desirable. Similarly, where compression is only slightly or insubstantially increased, overhead associated with replacing the first dictionary with another dictionary may cause a given candidate dictionary set to not meet replacement criteria. Additionally, where one or more dictionaries need to be sent to the user device to achieve improved compression, if such sending would be time and/or resource consuming such that presenting content was negatively impacted in terms of quality or time, then such a candidate dictionary exceed a replacement threshold. Where the replacement threshold is exceeded, the first dictionary is replaced 1514 with one or more generated dictionary that exceeds the threshold. However, if the replacement threshold is not exceeded, then implementation of the first dictionary is maintained 1516.

Figure 16:
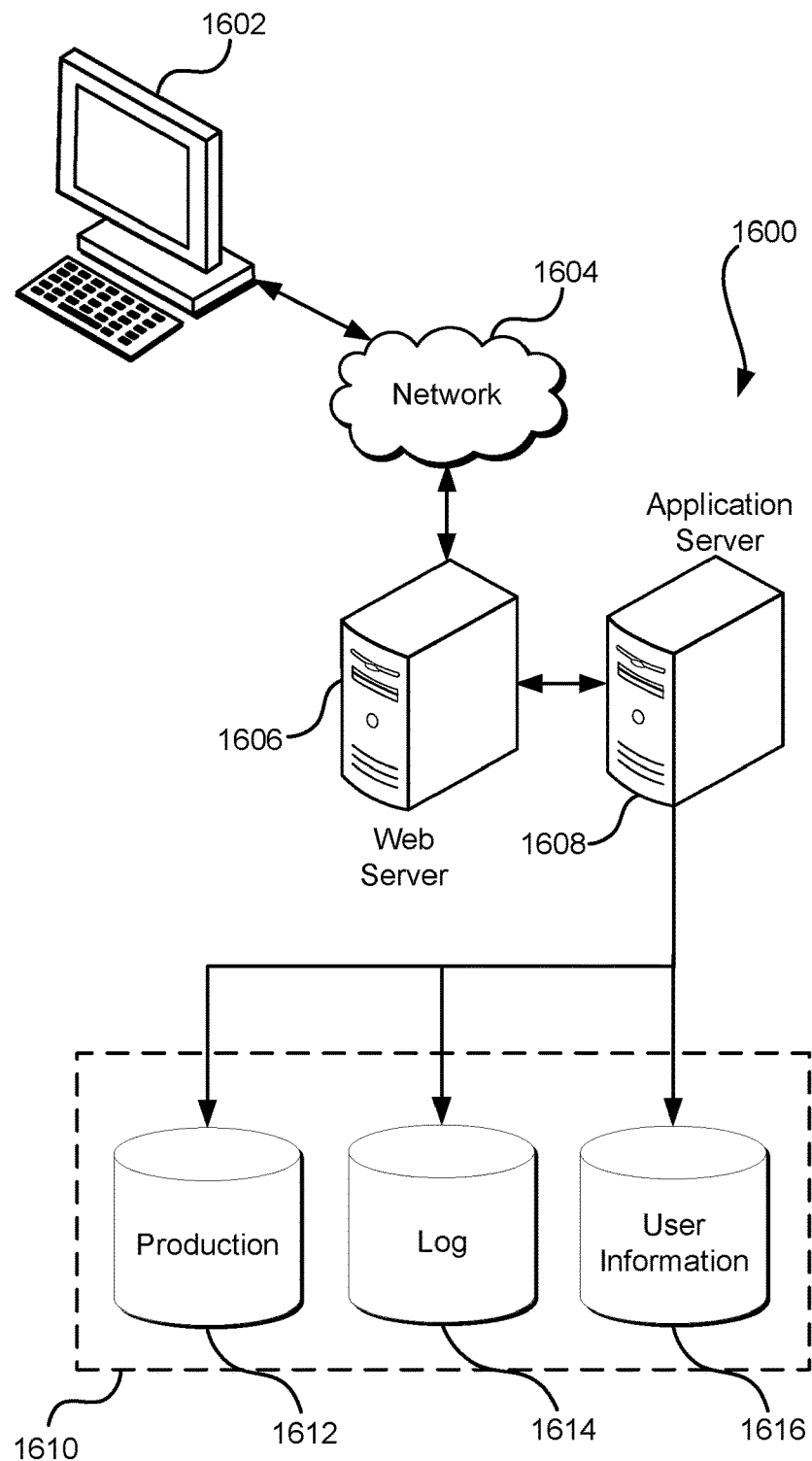
FIG. 16 illustrates an environment in which various examples can be implemented.

FIG. 16 illustrates aspects of an example environment 1600 for implementing aspects in accordance with various examples. As will be appreciated, although a web-based environment is used for purposes of explanation, different environments may be used, as appropriate, to implement various examples. The environment includes an electronic client device 1602, which can include any appropriate device operable to send and/or receive requests, messages, or information over an appropriate network 1604 and, in some examples, convey information back to a user of the device. Examples of such client devices include personal computers, cell phones, handheld messaging devices, laptop computers, tablet computers, set-top boxes, personal data assistants, embedded computer systems, electronic book readers, and the like. The network can include any appropriate network, including an intranet, the Internet, a cellular network, a local area network, a satellite network or any other such network and/or combination thereof. Components used for such a system can depend at least in part upon the type of network and/or environment selected. Many protocols and components for communicating via such a network are well known and will not be discussed herein in detail. Communication over the network can be enabled by wired or wireless connections and combinations thereof. In this example, the network includes the Internet and/or other publicly-addressable communications network, as the environment includes a web server 1606 for receiving requests and serving content in response thereto, although for other networks an alternative device serving a similar purpose could be used as would be apparent to one of ordinary skill in the art.

The illustrative environment includes at least one application server 1608 and a data store 1610. It should be understood that there can be several application servers, layers or other elements, processes or components, which may be chained or otherwise configured, which can interact to perform tasks such as obtaining data from an appropriate data store. Servers, as used herein, may be implemented in various ways, such as hardware devices or virtual computer systems. In some contexts, servers may refer to a programming module being executed on a computer system. As used herein, unless otherwise stated or clear from context, the term "data store" refers to any device or combination of devices capable of storing, accessing, and retrieving data, which may include any combination and number of data servers, databases, data storage devices, and data storage media, in any standard, distributed, virtual, or clustered environment. The application server can include any appropriate hardware, software, and firmware for integrating with the data store as needed to execute aspects of one or more applications for the client device, handling some or all of the data access and business logic for an application. The application server may provide access control services in cooperation with the data store and is able to generate content including, but not limited to, text, graphics, audio, video, and/or other content usable to be provided to the user, which may be served to the user by the web server in the form of HyperText Markup Language ("HTML"), Extensible Markup Language ("XML"), JavaScript, Cascading Style Sheets ("CSS"), JavaScript Object Notation (JSON), and/or another appropriate client-side structured language. Content transferred to a client device may be processed by the client device to provide the content in one or more forms including, but not limited to, forms that are perceptible to the user audibly, visually, and/or through other senses. The handling of all requests and responses, as well as the delivery of content between the client device 1602 and the application server 1608, can be handled by the web server using PHP: Hypertext Preprocessor ("PHP"), Python, Ruby, Perl, Java, HTML, XML, JSON, and/or another appropriate server-side structured language in this example. Further, operations described herein as being performed by a single device may, unless otherwise clear from context, be performed collectively by multiple devices, which may form a distributed and/or virtual system.

The data store 1610 can include several separate data tables, databases, data documents, dynamic data storage schemes and/or other data storage mechanisms and media for storing data relating to a particular aspect of the present disclosure. For example, the data store illustrated may include mechanisms for storing production data 1612 and user information 1616, which can be used to serve content for the production side. The data store also is shown to include a mechanism for storing log data 1614, which can be used for reporting, analysis or other such purposes. It should be understood that there can be many other aspects that may need to be stored in the data store, such as page image information and access rights information, which can be stored in any of the above listed mechanisms as appropriate or in additional mechanisms in the data store 1610. The data store 1610 is operable, through logic associated therewith, to receive instructions from the application server 1608 and obtain, update or otherwise process data in response thereto.

The application server 1608 may provide static, dynamic, or a combination of static and dynamic data in response to the received instructions. Dynamic data, such as data used in web logs (blogs), shopping applications, news services and other such applications may be generated by server-side structured languages as described herein or may be provided by a content management system ("CMS") operating on, or under the control of, the application server. In one example, a user, through a device operated by the user, might submit a search request for a certain type of item. In this case, the data store might access the user information to verify the identity of the user and can access the catalog detail information to obtain information about items of that type. The information then can be returned to the user, such as in a results listing on a web page that the user is able to view via a browser on the user device 1602. Information for a particular item of interest can be viewed in a dedicated page or window of the browser. It should be noted, however, that examples of the present disclosure are not necessarily limited to the context of web pages, but may be more generally applicable to processing requests in general, where the requests are not necessarily requests for content.

Each server typically will include an operating system that provides executable program instructions for the general administration and operation of that server and typically will include a computer-readable storage medium (e.g., a hard disk, random access memory, read only memory, etc.) storing instructions that, when executed (i.e., as a result of being executed) by a processor of the server, allow the server to perform its intended functions.

The environment, in one example, is a distributed and/or virtual computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 16. Thus, the depiction of the system 1600 in FIG. 16 should be taken as being illustrative in nature and not limiting to the scope of the disclosure.

The various examples further can be implemented in a wide variety of operating environments, which in some cases can include one or more user computers, computing devices or processing devices which can be used to operate any of a number of applications. User or client devices can include any of a number of computers, such as desktop, laptop, or tablet computers running a standard operating system, as well as cellular, wireless, and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems, and other devices capable of communicating via a network. These devices also can include virtual devices such as virtual machines, hypervisors, and other virtual devices capable of communicating via a network.

Various examples of the present disclosure utilize at least one network that would be familiar to those skilled in the art for supporting communications using any of a variety of commercially-available protocols, such as Transmission Control Protocol/Internet Protocol ("TCP/IP"), User Datagram Protocol ("UDP"), protocols operating in various layers of the Open System Interconnection ("OSI") model, File Transfer Protocol ("FTP"), Universal Plug and Play ("UpnP"), Network File System ("NFS"), Common Internet File System ("CIFS"), and AppleTalk. The network can be, for example, a local area network, a wide-area network, a virtual private network, the Internet, an intranet, an extranet, a public switched telephone network, an infrared network, a wireless network, a satellite network, and any combination thereof. In some examples, connection-oriented protocols may be used to communicate between network endpoints. Connection-oriented protocols (sometimes called connection-based protocols) are capable of transmitting data in an ordered stream. Connection-oriented protocols can be reliable or unreliable. For example, the TCP protocol is a reliable connection-oriented protocol. Asynchronous Transfer Mode ("ATM") and Frame Relay are unreliable connection-oriented protocols. Connection-oriented protocols are in contrast to packet-oriented protocols such as UDP that transmit packets without a guaranteed ordering.

In examples utilizing a web server, the web server can run any of a variety of server or mid-tier applications, including Hypertext Transfer Protocol ("HTTP") servers, FTP servers, Common Gateway Interface ("CGI") servers, data servers, Java servers, Apache servers, and business application servers. The server(s) also may be capable of executing programs or scripts in response to requests from user devices, such as by executing one or more web applications that may be implemented as one or more scripts or programs written in any programming language, such as Java®, C, C#, or C++, or any scripting language, such as Ruby, PHP, Perl, Python, or TCL, as well as combinations thereof. The server(s) may also include database servers, including without limitation those commercially available from Oracle®, Microsoft®, Sybase®, and IBM® as well as open-source servers such as MySQL, Postgres, SQLite, MongoDB, and any other server capable of storing, retrieving, and accessing structured or unstructured data. Database servers may include table-based servers, document-based servers, unstructured servers, relational servers, non-relational servers or combinations of these, and/or other database servers.

The environment can include a variety of data stores and other memory and storage media as discussed above. These can reside in a variety of locations, such as on a storage medium local to (and/or resident in) one or more of the computers or remote from any or all of the computers across the network. In a particular set of examples, the information may reside in a storage-area network ("SAN") familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit ("CPU" or "processor"), at least one input device (e.g., a mouse, keyboard, controller, touch screen or keypad) and at least one output device (e.g., a display device, printer, or speaker). Such a system may also include one or more storage devices, such as disk drives, optical storage devices and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services or other elements located within at least one working memory device, including an operating system and application programs, such as a client application or web browser. In addition, customized hardware might also be used and/or particular elements might be implemented in hardware, software (including portable software, such as applets), or both. Further, connection to other computing devices such as network input/output devices may be employed.

Storage media and computer readable media for containing code, or portions of code, can include any appropriate media known or used in the art, including storage media and communication media, such as, but not limited to, volatile and non-volatile, removable and non-removable media implemented in any method or technology for storage and/or transmission of information such as computer readable instructions, data structures, program modules, or other data, including RAM, ROM, Electrically Erasable Programmable Read-Only Memory ("EEPROM"), flash memory or other memory technology, Compact Disc Read-Only Memory ("CD-ROM"), digital versatile disk (DVD) or other optical storage, magnetic cassettes, magnetic tape, magnetic disk storage or other magnetic storage devices, or any other medium which can be used to store the desired information and which can be accessed by the system device. Based on the disclosure and teachings provided herein, a person of ordinary skill in the art will appreciate other ways and/or methods to implement the various examples.

The specification and drawings are, accordingly, to be regarded in an illustrative rather than a restrictive sense. It will, however, be evident that various modifications and changes may be made thereunto without departing from the broader spirit and scope of the invention as set forth in the claims.

Other variations are within the spirit of the present disclosure. Thus, while the disclosed techniques are susceptible to various modifications and alternative constructions, certain illustrated examples thereof are shown in the drawings and have been described above in detail. It should be understood, however, that there is no intention to limit the invention to the specific form or forms disclosed, but on the contrary, the intention is to cover all modifications, alternative constructions and equivalents falling within the spirit and scope of the invention, as defined in the appended claims.

The use of the terms "a" and "an" and "the" and similar referents in the context of describing the disclosed examples (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected," when unmodified and referring to physical connections, is to be construed as partly or wholly contained within, attached to or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. The use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but the subset and the corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in the illustrative example of a set having three members, the conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain examples require at least one of A, at least one of B and at least one of C each to be present.

Operations of processes described herein can be performed in any suitable order unless otherwise indicated herein or otherwise clearly contradicted by context. Processes described herein (or variations and/or combinations thereof) may be performed under the control of one or more computer systems configured with executable instructions and may be implemented as code (e.g., executable instructions, one or more computer programs or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory. In some examples, the code is stored on set of one or more non-transitory computer-readable storage media having stored thereon executable instructions that, when executed (i.e., as a result of being executed) by one or more processors of a computer system, cause the computer system to perform operations described herein. The set of non-transitory computer-readable storage media may comprise multiple non-transitory computer-readable storage media and one or more of individual non-transitory storage media of the multiple non-transitory computer-readable storage media may lack all of the code while the multiple non-transitory computer-readable storage media collectively store all of the code.

Accordingly, in some examples, computer systems are configured to implement one or more services that singly or collectively perform operations of processes described herein. Such computer systems may, for instance, be configured with applicable hardware and/or software that enable the performance of the operations. Further, computer systems that implement various examples of the present disclosure may, in some examples, be single devices and, in other examples, be distributed computer systems comprising multiple devices that operate differently such that the distributed computer system performs the operations described herein and such that a single device may not perform all operations.

The use of any and all examples, or exemplary language (e.g., "such as") provided herein, is intended merely to better illuminate examples of the invention and does not pose a limitation on the scope of the invention unless otherwise claimed. No language in the specification should be construed as indicating any non-claimed element as essential to the practice of the invention.

Examples of this disclosure are described herein, including the best mode known to the inventors for carrying out the invention. Variations of those examples may become apparent to those of ordinary skill in the art upon reading the foregoing description. The inventors expect skilled artisans to employ such variations as appropriate and the inventors intend for examples of the present disclosure to be practiced otherwise than as specifically described herein. Accordingly, the scope of the present disclosure includes all modifications and equivalents of the subject matter recited in the claims appended hereto as permitted by applicable law. Moreover, any combination of the above-described elements in all possible variations thereof is encompassed by the scope of the present disclosure unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. A computer-implemented method for generating compression dictionary snapshots, comprising:
    under the control of one or more computer systems configured with executable instructions,
    obtaining a snapshot manifest, the snapshot manifest including location information for a set of dictionary portions of a compression dictionary, the location information indicating an identity of a previous snapshot and a location of the dictionary portions within the previous snapshot, and the dictionary portions comprising one or more definitions;
    incrementing a snapshot count;
    determining a first subset of dictionary portions, the first subset of dictionary portions comprising dictionary portions of the set of dictionary portions that are new or have changed since a time of a most recent previous snapshot;
    determining, from the snapshot manifest, a second subset of dictionary portions based at least in part on a snapshot depth and the snapshot count;
    obtaining the first and second subsets of dictionary portions;
    generating at least a snapshot update of the set of dictionary portions based at least in part on the obtained subsets of dictionary portions; and
    storing the at least a snapshot update of the set of dictionary portions.

2. The computer-implemented method of claim 1, wherein the compression dictionary is defined by one or more base dictionaries and one or more sub-dictionaries.

3. The computer-implemented method of claim 1, wherein the snapshot manifest is a first snapshot manifest and the method further comprises:
    receiving a request to restore the set of dictionary portions to a particular location;
    obtaining a second snapshot manifest, the second snapshot manifest including locations of dictionary portions of the obtained first and second subsets of dictionary portions in the at least a snapshot update; and
    iterating through the locations of dictionary portions indicated in the second snapshot manifest and copying the dictionary portions from the indicated locations to the particular location.

4. The computer-implemented method of claim 1, further comprising:
selecting a first set of compression dictionaries to compress content requested by a user device based at least in part on a second set of compression dictionaries available at the user device and a third set of locally available compression dictionaries that includes the at least a snapshot update of the set of dictionary portions; and
sending the at least a snapshot update of the set of dictionary portions to the user device at least based on the selecting of the first set of compression dictionaries.

5. A system, comprising:
memory storing a dictionary defining a set of definitions;
one or more processors; and
memory including instructions that, when executed by the one or more processors, cause the system to:
generate a set of snapshots by causing the system to:
determine a subset of the set of definitions, the subset comprising:
a first subset comprising one or more definitions that have changed since a time of a previous snapshot; and
a second subset comprising one or more definitions associated with a predetermined portion of the dictionary; and
generate and store the snapshots based at least in part on the determined subset of one or more definitions; and
determine the plurality of active snapshots from the set of snapshots such that the set of one or more definitions is included in the plurality of active snapshots.

6. The system of claim 5, wherein:
the subset is the first subset; and
the instructions further cause the system to:
receive a request to restore a second subset of the set of one or more definitions to a storage location; and
in response to receiving the request, obtain definitions of the second subset from at least one of the plurality of active snapshots and store the one or more definitions at the storage location.

7. The system of claim 5, wherein:
selecting a first set of compression dictionaries to compress communications with a device based at least in part on a second set of compression dictionaries available at the device and a third set of locally available compression dictionaries that includes the plurality of active snapshots; and
sending the at least a portion of the plurality of active snapshots to the device for use in compression of communications with the device.

8. The system of claim 5, wherein the instructions that cause the system to generate and store snapshots further cause the system to:
obtain the first subset of one or more definitions from the dictionary;
obtain the second subset of one or more definitions, wherein at least a portion of the second subset of one or more definitions is obtained from a previously generated active snapshot of the plurality of active snapshots;
generate the snapshot based at least in part on the obtained first and second subsets of one or more definitions; and
store the snapshot for use in compression of communications between a device and server.

9. The system of claim 5, wherein the instructions further cause the system to send the plurality of active snapshots to a user device so that the user device and system share a common set of definitions used by the system to compress a set of communications and used by the user device to decompress the set of communications.

10. The system of claim 5, wherein the instructions that cause the system to determine the subset of the set of one or more definitions further cause the system to obtain a manifest that indicates an identity and location for definitions required to restore the dictionary to a state of the dictionary at a time corresponding to the snapshot, the manifest comprising:
a first identity and location in the dictionary for definitions in the first subset of one or more definitions; and
a second identity and location in the plurality of active snapshots for definitions in the second subset of one or more definitions.

11. The system of claim 5, wherein the instructions further cause the system to:
generate a current state of the dictionary based at least in part on a portion of the plurality snapshots to result in an updated dictionary; and
send the updated dictionary to a user device for use in compression of communications with the user device.

12. The system of claim 5, wherein the dictionary is defined by one or more base dictionaries and one or more sub-dictionaries that depends from a base dictionary.

13. A non-transitory computer-readable storage medium having stored thereon executable instructions that, when executed by one or more processors of a computer system, cause the computer system to at least:
determine a first set of one or more definitions including one or more definitions that have changed since a time of a previous snapshot;
determine a second set of one or definitions based at least in part on a predetermined portion of a dictionary;
generate at least one snapshot update of the dictionary based at least in part on a combination of the first set of one or more definitions and the second set of one or more definitions;
store the at least one snapshot update for use in compressing communications.

14. The non-transitory computer-readable storage medium of claim 13, wherein the instructions further include instructions that, when executed by the one or more processors, cause the computer system to:
receive a request to restore at least a portion of a dictionary to a previous state;
determine a third set of one or more definitions defined by the dictionary, the third set of one or more definitions including one or more definitions from the combination of the first set of one or more definitions and the second set of one or more definitions;
obtain the third set of one or more definitions in part from the at least one snapshot update; and
restore the dictionary by storing the obtained third set of one or more definitions.

15. The non-transitory computer-readable storage medium of claim 13, wherein the first set and the second set are disjoint sets.

16. The non-transitory computer-readable storage medium of claim 13, wherein the instructions that cause the computer system to generate the at least one snapshot update include instructions that cause the computer system to:
obtain the first set of one or more definitions from a dictionary defining a plurality of definitions;

obtain the second set of one or more definitions, wherein at least a subset of the second set of one or more definitions are obtained from a previously generated snapshot update; and generate the at least one snapshot update at least in part from the obtained first and second sets of one or more definitions.

17. The non-transitory computer-readable storage medium of claim 13, wherein the instructions that cause the computer system to determine the second set of one or more definitions further include instructions that cause the computer system to exclude a same definition from the second set of one or more definitions if the determined first set of one or more definitions includes the same definition.

18. The non-transitory computer-readable storage medium of claim 13, wherein the instructions further include instructions that cause the computer system to:

select a first set of compression dictionaries to compress communications with a device based at least in part on a second set of compression dictionaries available at the device and a third set of locally available compression dictionaries that includes the at least one snapshot update; and send the at least one snapshot update to the device for use in compression of communications with the device.

19. The non-transitory computer-readable storage medium of claim 13, wherein the instructions further cause the computer system to send a of active snapshots to a user device so that the user device and system share a common set of definitions used by the system to compress a set of communications and used by the user device to decompress the set of communications.

20. The non-transitory computer-readable storage medium of claim 13, wherein the instructions that cause the computer system to determine the second set of one or more definitions include instructions that cause the computer system to:

increment a snapshot count;

obtain a manifest that includes an entry for definitions of the dictionary; and determine the second set of one or more definitions based at least in part on the manifest, the snapshot count, and a snapshot depth.

* * * * *